United States Patent
Schowalter et al.

(10) Patent No.: US 10,074,784 B2
(45) Date of Patent: Sep. 11, 2018

(54) PHOTON EXTRACTION FROM NITRIDE ULTRAVIOLET LIGHT-EMITTING DEVICES

(71) Applicants: Leo J. Schowalter, Latham, NY (US); Jianfeng Chen, Ballston Lake, NY (US); James R. Grandusky, Waterford, NY (US)

(72) Inventors: Leo J. Schowalter, Latham, NY (US); Jianfeng Chen, Ballston Lake, NY (US); James R. Grandusky, Waterford, NY (US)

(73) Assignee: CRYSTAL IS, INC., Green Island, NY (US)

( * ) Notice: Subject to any disclaimer, the term of this patent is extended or adjusted under 35 U.S.C. 154(b) by 449 days.

(21) Appl. No.: 14/596,806

(22) Filed: Jan. 14, 2015

(65) Prior Publication Data
US 2016/0181487 A1    Jun. 23, 2016

Related U.S. Application Data

(63) Continuation of application No. 13/553,093, filed on Jul. 19, 2012, now Pat. No. 8,962,359.
(Continued)

(51) Int. Cl.
*H01L 33/58* (2010.01)
*H01L 33/54* (2010.01)
(Continued)

(52) U.S. Cl.
CPC .............. *H01L 33/58* (2013.01); *H01L 33/22* (2013.01); *H01L 33/405* (2013.01); *H01L 33/54* (2013.01);
(Continued)

(58) Field of Classification Search
CPC ....... H01L 33/405; H01L 33/58; H01L 33/22; H01L 33/54; H01L 33/56; H01L 33/12; H01L 2933/0058
(Continued)

(56) References Cited

U.S. PATENT DOCUMENTS 3,531,245 A    9/1970    Dietz
3,600,701 A    8/1971    Gouldthorpe
(Continued)

FOREIGN PATENT DOCUMENTS

CN    2492947 Y    5/2002
CN    201274297    7/2009
(Continued)

OTHER PUBLICATIONS

U.S. Appl. No. 11/265,909, filed Nov. 3, 2005, by Schowalter et al.; Advisory Action dated Sep. 25, 2009; Advisory Action dated Oct. 21, 2009 and Non Final Office Action dated Jun. 4, 2008.
(Continued)

*Primary Examiner* — Michael Trinh
(74) *Attorney, Agent, or Firm* — Morgan, Lewis & Bockius LLP

(57) ABSTRACT

In various embodiments, a rigid lens is attached to a light-emitting semiconductor die via a layer of encapsulant having a thickness insufficient to prevent propagation of thermal expansion mismatch-induced strain between the rigid lens and the semiconductor die.

24 Claims, 10 Drawing Sheets

Related U.S. Application Data

(60) Provisional application No. 61/509,278, filed on Jul. 19, 2011, provisional application No. 61/552,138, filed on Oct. 27, 2011.

(51) Int. Cl.
  *H01L 33/22* (2010.01)
  *H01L 33/40* (2010.01)
  *H01L 33/56* (2010.01)

(52) U.S. Cl.
  CPC ...... *H01L 33/56* (2013.01); *H01L 2933/0058* (2013.01)

(58) Field of Classification Search
  USPC .... 257/99, 88, 98, E33.059; 438/22, 27, 25, 438/26
  See application file for complete search history.

(56) References Cited

U.S. PATENT DOCUMENTS

| | | | |
|---|---|---|---|
| 3,603,414 A | 9/1971 | Stebley | |
| 3,607,014 A | 9/1971 | Huml et al. | |
| 3,634,149 A | 1/1972 | Knippenberg et al. | |
| 3,768,983 A | 10/1973 | Elkins et al. | |
| 3,903,357 A | 9/1975 | Woolfson et al. | |
| 3,933,573 A | 1/1976 | Dugger | |
| 4,008,851 A | 2/1977 | Hirsch | |
| 4,088,515 A | 5/1978 | Blakeslee et al. | |
| 4,234,554 A | 11/1980 | Rabenau et al. | |
| 4,547,471 A | 10/1985 | Huseby et al. | |
| 5,057,287 A | 10/1991 | Swiggard | |
| 5,070,393 A | 12/1991 | Nakagawa et al. | |
| 5,087,949 A | 2/1992 | Haitz | |
| 5,292,487 A | 3/1994 | Tatsumi et al. | |
| 5,312,698 A | 5/1994 | Sato et al. | |
| 5,494,861 A | 2/1996 | Yamaga et al. | |
| 5,520,785 A | 5/1996 | Evans et al. | |
| 5,525,320 A | 6/1996 | Pratsinis et al. | |
| 5,571,603 A | 11/1996 | Utumi et al. | |
| 5,670,798 A | 9/1997 | Schetzina | |
| 5,679,965 A | 10/1997 | Schetzina | |
| 5,703,397 A | 12/1997 | Endo et al. | |
| 5,728,635 A | 3/1998 | Kobayashi et al. | |
| 5,858,085 A | 1/1999 | Arai et al. | |
| 5,858,086 A | 1/1999 | Hunter | |
| 5,868,837 A | 2/1999 | DiSalvo et al. | |
| 5,909,036 A | 6/1999 | Tanaka et al. | |
| 5,924,874 A | 7/1999 | Gotoh et al. | |
| 5,954,874 A | 9/1999 | Hunter | |
| 5,972,109 A | 10/1999 | Hunter | |
| 5,981,980 A | 11/1999 | Miyajima et al. | |
| 6,000,174 A | 12/1999 | Yamazaki et al. | |
| 6,001,748 A | 12/1999 | Tanaka et al. | |
| 6,006,620 A | 12/1999 | Lawrie et al. | |
| 6,045,612 A | 4/2000 | Hunter | |
| 6,048,813 A | 4/2000 | Hunter | |
| 6,063,185 A | 5/2000 | Hunter | |
| 6,066,205 A | 5/2000 | Hunter | |
| 6,086,672 A | 7/2000 | Hunter | |
| 6,091,085 A | 7/2000 | Lester | |
| 6,187,089 B1 | 2/2001 | Phillips et al. | |
| 6,211,089 B1 | 4/2001 | Kim et al. | |
| 6,270,569 B1 | 8/2001 | Shibata et al. | |
| 6,296,956 B1 | 10/2001 | Hunter | |
| 6,398,867 B1 | 6/2002 | D'Evelyn et al. | |
| 6,404,125 B1 | 6/2002 | Garbuzov et al. | |
| 6,447,604 B1 | 9/2002 | Flynn et al. | |
| 6,468,347 B1 | 10/2002 | Motoki et al. | |
| 6,515,308 B1 | 2/2003 | Kneissl et al. | |
| 6,533,874 B1 | 3/2003 | Vaudo et al. | |
| 6,548,405 B2 | 4/2003 | Kraus et al. | |
| 6,592,663 B1 | 7/2003 | Sarayama et al. | |
| 6,596,079 B1 | 7/2003 | Vaudo et al. | |
| 6,719,843 B2 | 4/2004 | Schowalter et al. | |
| 6,770,135 B2 | 8/2004 | Schowalter et al. | |
| 6,777,717 B1 | 8/2004 | Karlicek | |
| 6,791,119 B2 | 9/2004 | Slater, Jr. et al. | |
| 6,800,876 B2 | 10/2004 | Edmond et al. | |
| 6,831,302 B2 | 12/2004 | Erchak | |
| 6,840,431 B1 | 1/2005 | Rojo et al. | |
| 6,861,729 B2 | 3/2005 | Kozaki et al. | |
| 6,891,268 B2 | 5/2005 | Tomiya et al. | |
| 6,921,929 B2 * | 7/2005 | LeBoeuf ............... H01L 33/502 257/100 |
| 6,936,357 B2 | 8/2005 | Melnik et al. | |
| 6,940,075 B2 | 9/2005 | Schulz | |
| 6,995,402 B2 | 2/2006 | Ludowise et al. | |
| 7,026,659 B2 | 4/2006 | Slater, Jr. et al. | |
| 7,037,738 B2 | 5/2006 | Sugiyama et al. | |
| 7,037,838 B2 | 5/2006 | Schowalter et al. | |
| 7,056,383 B2 | 6/2006 | Helava et al. | |
| 7,063,741 B2 | 6/2006 | D'Evelyn et al. | |
| 7,087,112 B1 | 8/2006 | Rojo et al. | |
| 7,095,054 B2 | 8/2006 | Fjelstad | |
| 7,125,734 B2 | 10/2006 | Sackrison | |
| 7,186,580 B2 | 3/2007 | Tran et al. | |
| 7,211,146 B2 | 5/2007 | Schowalter et al. | |
| 7,211,831 B2 | 5/2007 | Erchak et al. | |
| 7,244,520 B2 | 7/2007 | Kumakura et al. | |
| 7,250,637 B2 | 7/2007 | Shimizu | |
| 7,274,043 B2 | 9/2007 | Erchak et al. | |
| 7,276,779 B2 | 10/2007 | Shibata | |
| 7,288,152 B2 | 10/2007 | Kitaoka et al. | |
| 7,420,218 B2 | 9/2008 | Nagai | |
| 7,420,222 B2 | 9/2008 | Slater, Jr. et al. | |
| 7,439,552 B2 | 10/2008 | Takigawa et al. | |
| 7,476,910 B2 | 1/2009 | Fujimoto et al. | |
| 7,518,158 B2 | 4/2009 | Keller et al. | |
| 7,524,376 B2 | 4/2009 | Wang | |
| 7,554,128 B2 | 6/2009 | Okamoto et al. | |
| 7,631,986 B2 | 12/2009 | Harrah | |
| 7,638,346 B2 | 12/2009 | Schowalter et al. | |
| 7,641,735 B2 | 1/2010 | Slack et al. | |
| 7,674,699 B2 | 3/2010 | Shibata | |
| 7,678,195 B2 | 3/2010 | Schlesser et al. | |
| 7,713,844 B2 | 5/2010 | Nishiura et al. | |
| 7,750,355 B2 | 7/2010 | Dwilinski et al. | |
| 7,755,103 B2 | 7/2010 | Ueno | |
| 7,776,153 B2 | 8/2010 | Schowalter | |
| 7,803,733 B2 | 9/2010 | Teratani et al. | |
| 7,832,885 B2 * | 11/2010 | Hsiao et al. ............... 362/84 |
| 7,902,566 B2 | 3/2011 | Paolini et al. | |
| 7,943,952 B2 | 5/2011 | Loh et al. | |
| 7,956,372 B2 | 6/2011 | Kamada et al. | |
| 7,976,186 B2 | 7/2011 | Loh | |
| 8,012,257 B2 | 9/2011 | Morgan et al. | |
| 8,080,833 B2 | 12/2011 | Grandusky et al. | |
| 8,088,220 B2 | 1/2012 | Slack et al. | |
| 8,123,859 B2 | 2/2012 | Schowalter et al. | |
| 8,222,650 B2 | 7/2012 | Schowalter et al. | |
| 8,323,406 B2 | 12/2012 | Bondokov et al. | |
| 8,349,077 B2 | 1/2013 | Bondokov et al. | |
| 8,545,629 B2 | 10/2013 | Schowalter et al. | |
| 8,580,035 B2 | 11/2013 | Bondokov et al. | |
| 8,747,552 B2 | 6/2014 | Slack et al. | |
| 8,834,630 B2 | 9/2014 | Bondokov et al. | |
| 8,896,020 B2 | 11/2014 | Schowalter et al. | |
| 8,962,359 B2 | 2/2015 | Schowalter et al. | |
| 2001/0000209 A1 | 4/2001 | Krames et al. | |
| 2001/0005023 A1 | 6/2001 | Itoh et al. | |
| 2001/0024871 A1 | 9/2001 | Yagi | |
| 2001/0051433 A1 | 12/2001 | Francis et al. | |
| 2002/0030194 A1 | 3/2002 | Camras et al. | |
| 2002/0170490 A1 | 11/2002 | Vodakov et al. | |
| 2003/0047816 A1 | 3/2003 | Dutta | |
| 2003/0094664 A1 * | 5/2003 | Yagi ............... 257/431 |
| 2003/0160254 A1 | 8/2003 | Henrichs | |
| 2003/0168003 A1 | 9/2003 | Schowalter et al. | |
| 2003/0213964 A1 | 11/2003 | Flynn | |
| 2003/0216011 A1 | 11/2003 | Nakamura et al. | |
| 2004/0033690 A1 | 2/2004 | Schowalter et al. | |
| 2004/0104442 A1 | 6/2004 | Feudel et al. | |
| 2004/0130002 A1 | 7/2004 | Weeks et al. | |

(56) References Cited

U.S. PATENT DOCUMENTS

| | | |
|---|---|---|
| 2004/0187766 A1 | 9/2004 | Letertre |
| 2004/0206978 A1 | 10/2004 | Saxler |
| 2004/0213309 A9 | 10/2004 | Amano et al. |
| 2004/0224484 A1 | 11/2004 | Fareed et al. |
| 2004/0226917 A1 | 11/2004 | Laconto et al. |
| 2004/0245535 A1 | 12/2004 | D'Evelyn et al. |
| 2004/0251471 A1 | 12/2004 | Dwilinski et al. |
| 2005/0062392 A1 | 3/2005 | Sakai et al. |
| 2005/0072986 A1 | 4/2005 | Sasaoka |
| 2005/0103257 A1 | 5/2005 | Xu et al. |
| 2005/0142391 A1 | 6/2005 | Dmitriev et al. |
| 2005/0161697 A1 | 7/2005 | Nakahata et al. |
| 2005/0164044 A1 | 7/2005 | Melnik et al. |
| 2005/0214992 A1 | 9/2005 | Chakraborty et al. |
| 2005/0269577 A1 | 12/2005 | Ueda et al. |
| 2005/0277214 A1 | 12/2005 | Uematsu et al. |
| 2005/0285141 A1 | 12/2005 | Piner et al. |
| 2006/0005763 A1 | 1/2006 | Schowalter et al. |
| 2006/0029832 A1 | 2/2006 | Xu et al. |
| 2006/0054075 A1 | 3/2006 | Dwilinski et al. |
| 2006/0118820 A1 | 6/2006 | Gaska et al. |
| 2006/0181695 A1 | 8/2006 | Sage, Jr. |
| 2006/0244011 A1 | 11/2006 | Saxler |
| 2006/0255341 A1 | 11/2006 | Pinnington et al. |
| 2006/0281205 A1 | 12/2006 | Park |
| 2006/0288929 A1 | 12/2006 | Slack et al. |
| 2007/0018184 A1 | 1/2007 | Beeson et al. |
| 2007/0082019 A1 | 4/2007 | Huang et al. |
| 2007/0101932 A1* | 5/2007 | Schowalter et al. .......... 117/952 |
| 2007/0102721 A1 | 5/2007 | Denbaars et al. |
| 2007/0131160 A1 | 6/2007 | Slack et al. |
| 2007/0134827 A1 | 6/2007 | Bondokov et al. |
| 2007/0151905 A1 | 7/2007 | Wang |
| 2007/0224714 A1 | 9/2007 | Ikeda et al. |
| 2007/0243653 A1 | 10/2007 | Morgan et al. |
| 2007/0257333 A1 | 11/2007 | Schlesser et al. |
| 2008/0006200 A1 | 1/2008 | Schowalter et al. |
| 2008/0012034 A1 | 1/2008 | Thielen et al. |
| 2008/0023719 A1* | 1/2008 | Camras et al. ............. 257/98 |
| 2008/0036038 A1 | 2/2008 | Hersee et al. |
| 2008/0054280 A1 | 3/2008 | Reginelli et al. |
| 2008/0087984 A1 | 4/2008 | Melas |
| 2008/0121910 A1 | 5/2008 | Bergmann et al. |
| 2008/0123711 A1 | 5/2008 | Chua et al. |
| 2008/0135861 A1 | 6/2008 | Pokrovskiy et al. |
| 2008/0142817 A1 | 6/2008 | Ibbetson et al. |
| 2008/0144688 A1 | 6/2008 | Chua et al. |
| 2008/0149945 A1 | 6/2008 | Nagai |
| 2008/0149960 A1 | 6/2008 | Amo et al. |
| 2008/0157111 A1 | 7/2008 | Erchak et al. |
| 2008/0173887 A1 | 7/2008 | Baba et al. |
| 2008/0182092 A1 | 7/2008 | Bondokov et al. |
| 2008/0187016 A1 | 8/2008 | Schowalter et al. |
| 2008/0191225 A1 | 8/2008 | Medendorp |
| 2008/0246047 A1 | 10/2008 | Hsu et al. |
| 2008/0251808 A1 | 10/2008 | Kususe et al. |
| 2008/0258165 A1 | 10/2008 | Zimmerman |
| 2009/0008654 A1 | 1/2009 | Nagai |
| 2009/0014742 A1 | 1/2009 | Erchak |
| 2009/0039373 A1 | 2/2009 | Saito et al. |
| 2009/0050050 A1 | 2/2009 | Slack et al. |
| 2009/0065791 A1 | 3/2009 | Yen et al. |
| 2009/0065792 A1 | 3/2009 | Thompson et al. |
| 2009/0072263 A1* | 3/2009 | Paolini et al. .............. 257/98 |
| 2009/0078957 A1 | 3/2009 | Hoshina |
| 2009/0090932 A1 | 4/2009 | Bour et al. |
| 2009/0121246 A1 | 5/2009 | Denbaars et al. |
| 2009/0121250 A1 | 5/2009 | Denbaars et al. |
| 2009/0140279 A1 | 6/2009 | Zimmerman et al. |
| 2009/0141502 A1 | 6/2009 | Sonoda et al. |
| 2009/0155969 A1 | 6/2009 | Chakravarti et al. |
| 2009/0155989 A1 | 6/2009 | Uematsu et al. |
| 2009/0159910 A1 | 6/2009 | Lin et al. |
| 2009/0166657 A1 | 7/2009 | Yamada et al. |
| 2009/0173958 A1 | 7/2009 | Chakraborty et al. |
| 2009/0233394 A1 | 9/2009 | Batres et al. |
| 2009/0239357 A1 | 9/2009 | Amano et al. |
| 2009/0256163 A1 | 10/2009 | Chakraborty |
| 2009/0261372 A1 | 10/2009 | Ueda |
| 2009/0267098 A1 | 10/2009 | Choi |
| 2009/0278148 A1 | 11/2009 | Nabekura et al. |
| 2009/0283028 A1 | 11/2009 | Schowalter et al. |
| 2009/0315054 A1 | 12/2009 | Kim et al. |
| 2009/0321758 A1 | 12/2009 | Liu et al. |
| 2009/0321771 A1 | 12/2009 | Hattori et al. |
| 2010/0006870 A1 | 1/2010 | Lee et al. |
| 2010/0012956 A1 | 1/2010 | Yoo et al. |
| 2010/0025717 A1 | 2/2010 | Fujii et al. |
| 2010/0025719 A1 | 2/2010 | Li |
| 2010/0073940 A1* | 3/2010 | Huang ............... G02B 27/0955 |
| | | 362/361 |
| 2010/0135349 A1 | 6/2010 | Schowalter et al. |
| 2010/0187541 A1 | 7/2010 | Slack et al. |
| 2010/0264460 A1 | 10/2010 | Grandusky et al. |
| 2010/0314551 A1 | 12/2010 | Bettles et al. |
| 2011/0008621 A1 | 1/2011 | Morgan et al. |
| 2011/0008923 A1 | 1/2011 | Lin et al. |
| 2011/0011332 A1 | 1/2011 | Rojo et al. |
| 2011/0062469 A1* | 3/2011 | Camras et al. ................. 257/98 |
| 2012/0000414 A1 | 1/2012 | Bondokov et al. |
| 2012/0021175 A1 | 1/2012 | Moody et al. |
| 2012/0104355 A1 | 5/2012 | Grandusky et al. |
| 2012/0146047 A1 | 6/2012 | Kneissl et al. |
| 2013/0026525 A1 | 1/2013 | Chen et al. |
| 2013/0082237 A1 | 4/2013 | Northrup et al. |
| 2013/0099141 A1 | 4/2013 | Chua |
| 2013/0152852 A1 | 6/2013 | Bondokov et al. |
| 2013/0157442 A1 | 6/2013 | Bondokov et al. |
| 2014/0061666 A1 | 3/2014 | Schowalter et al. |
| 2014/0093671 A1 | 4/2014 | Bondokov et al. |
| 2014/0203311 A1 | 7/2014 | Schowalter et al. |
| 2014/0231725 A1 | 8/2014 | Slack et al. |
| 2014/0264263 A1 | 9/2014 | Grandusky et al. |
| 2015/0013592 A1 | 1/2015 | Bondokov et al. |
| 2015/0020731 A1 | 1/2015 | Bondokov et al. |
| 2015/0079329 A1 | 3/2015 | Schowalter et al. |

FOREIGN PATENT DOCUMENTS

| | | |
|---|---|---|
| CN | 101680115 A | 3/2010 |
| CN | 103038400 A | 4/2013 |
| DE | 102 48 964 | 4/2004 |
| EP | 0 609 799 | 8/1994 |
| EP | 0 811 708 | 12/1997 |
| EP | 0 979 883 | 2/2000 |
| EP | 1 211 715 | 6/2002 |
| EP | 1544925 | 6/2005 |
| EP | 1 732 145 | 12/2006 |
| EP | 1 754 810 | 2/2007 |
| EP | 1852528 A1 | 11/2007 |
| EP | 2 099 068 | 9/2009 |
| EP | 2287367 A1 | 2/2011 |
| EP | 2588651 A1 | 5/2013 |
| JP | 61/236686 | 10/1986 |
| JP | 02/018379 | 1/1990 |
| JP | 03/285075 | 12/1991 |
| JP | 4355920 | 12/1992 |
| JP | 9-83016 A | 3/1997 |
| JP | 2000-31059 A | 1/2000 |
| JP | 00/154090 | 6/2000 |
| JP | 01/192647 | 7/2001 |
| JP | 2002-274996 A | 9/2002 |
| JP | 2003-197541 A | 7/2003 |
| JP | 2005-167275 A | 6/2005 |
| JP | 2005-210084 A | 8/2005 |
| JP | 2005-536873 A | 12/2005 |
| JP | 2006-511432 A | 4/2006 |
| JP | 06/169173 | 6/2006 |
| JP | 2006-319107 A | 11/2006 |
| JP | 2006-335608 A | 12/2006 |
| JP | 2011-60986 A | 3/2011 |
| JP | 2013-32287 A | 2/2013 |
| JP | 2013-155112 A | 8/2013 |
| JP | 2013-542155 A | 11/2013 |

(56) References Cited

FOREIGN PATENT DOCUMENTS

| KR | 1020050028630 | * | 10/2006 |
|---|---|---|---|
| WO | WO-99/034037 | | 7/1999 |
| WO | WO-00/022203 | | 4/2000 |
| WO | WO-01/011116 | | 2/2001 |
| WO | WO-03/007383 | | 1/2003 |
| WO | WO-03/081730 | | 10/2003 |
| WO | 2004/061896 A2 | | 7/2004 |
| WO | WO-05/012602 | | 2/2005 |
| WO | WO-06/110512 | | 10/2006 |
| WO | WO-07/062250 | | 5/2007 |
| WO | 2007/113537 A1 | | 10/2007 |
| WO | WO-08/042020 | | 4/2008 |
| WO | 2008/088838 A1 | | 7/2008 |
| WO | 2012/003304 A1 | | 1/2012 |
| WO | 2012/012010 A2 | | 1/2012 |
| WO | 2014/151264 A1 | | 9/2014 |

OTHER PUBLICATIONS

U.S. Appl. No. 11/431,090, filed May 9, 2006, by Schowalter et al.; Advisory Action dated Apr. 21, 2009; Advisory Action dated Oct. 2, 2009 and Notice of Allowance dated Jun. 3, 2013.

U.S. Appl. No. 11/605,192, filed Nov. 28, 2006, by Bondokov et al.; Notice of Allowance dated Sep. 7, 2012.

U.S. Appl. No. 12/020,006, filed Jan. 25, 2008, by Schowalter et al.; Non-Final Office Action dated Nov. 25, 2011.

U.S. Appl. No. 12/642,182, filed Dec. 18, 2009, by Slack et al.; Non-Final Office dated Aug. 2, 2013; Final Office Action dated Dec. 9, 2013 and Notice of Allowance dated Mar. 17, 2014.

U.S. Appl. No. 12/827,507, filed Jun. 30, 2010, by Schujman et al.; Non-Final Office Action dated Nov. 6, 2013; Non-Final Office Action dated Jul. 16, 2014; and Notice of Allowance dated Jan. 16, 2015.

U.S. Appl. No. 13/173,213, filed Jun. 30, 2011, by Bondokov et al.; Non-Final Office Action dated Aug. 6, 2014 and Notice of Allowance dated Jan. 14, 2015.

U.S. Appl. No. 13/298,570, filed Nov. 17, 2011, by Grandusky et al.; Non-Final Office Action dated May 14, 2014; Final Office Action dated Nov. 19, 2014 and Non-Final Office Action dated Apr. 21, 2015.

U.S. Appl. No. 13/669,630, filed Nov. 6, 2012, by Bondokov et al.; Non-Final Office Action dated Dec. 20, 2013 and Notice of Allowance dated May 19, 2014.

U.S. Appl. No. 13/706,966, filed Dec. 6, 2012, by Bondokov et al.; Non-Final Office Action dated Apr. 1, 2013 and Notice of Allowance dated Jul. 18, 2013.

U.S. Appl. No. 13/974,710, filed Aug. 23, 2013, by Schowalter et al.; Notice of Allowance dated Jul. 22, 2014.

U.S. Appl. No. 14/208,379, filed Mar. 13, 2014, by Grandusky et al.; Non-Final Office Action dated Jan. 16, 2015.

U.S. Appl. No. 14/225,999, filed Mar. 26, 2014, by Slack et al.

U.S. Appl. No. 14/458,825, filed Aug. 13, 2014, by Bondokov et al.

U.S. Appl. No. 14/458,861, filed Aug. 13, 2014, by Bondokov et al.

U.S. Appl. No. 14/520,615, filed Oct. 22, 2014, by Schowalter et al.

U.S. Appl. No. 14/208,089, filed Mar. 13, 2014, by Grandusky et al.

U.S. Appl. No. 14/051,566, filed Oct. 11, 2013, by Robert Bondokov et al.

U.S. Appl. No. 14/684,754, filed Apr. 13, 2015, by Bondokov et al.

U.S. Appl. No. 14/686,812, filed Apr. 15, 2015, by Bondokov et al.

Arulkumaran et al., "Improved dc characteristics of AlGaN/GaN high-electron-mobility transistors on AlN/sapphire templates," (2002) *Applied Physics Letters*, vol. 81, No. 6, pp. 1131-1133.

Balkas et al., "Sublimation Growth and Characterizations of Bulk Aluminum Nitride Single Crystals," *J. Crystal Growth*, (1997) 179, p. 363.

Barin, *Thermochemical Data of Pure Substances*, 2nd Ed., (1993) pp. 42, 1334-1335, 1337, 1381-1382, 1636-1639.

Bickermann et al., "Characterization of bulk AlN with low oxygen content," *Jrl. of Crys. Growth*, vol. 269, Nos. 2-4, pp. 432-442.

Bockowski et al., "Combustion Synthesis of Aluminum Nitride Under High Pressure of Nitrogen and Nitrogen-Argon Mixtures," 5 *J. Mat. Synthesis & Processing 6*, (1997) pp. 449-458.

Bolgar et al., "Vaporization of the Nitrides of B, Al, and Ga," in *Khim Fiz. Nitrodov*, pp. 151-156 (1968) [Chem Abstr. 71, 34003j (1969)].

Chase et al., *J. Phys. Chem. Ref.* Data 14, Supplement No. 1 (1985).

Chase, *J. Phys. Chem.*, Ref. Data, Monograph No. 9, NIST-JANAF Thermochemical Tables, 4th Ed. (1998).

Chitnis et al., "Milliwatt Power AlGaN Quantum Well Deep Ultraviolet Light Emitting Diodes," *Phys. Sat. Sol.* (a), (2003) vol. 200, No. 1, pp. 99-101.

Constantin et al., "Mixing rocksalt and wurtzite structure binary nitrides to form novel ternary alloys: ScGaN and MnGaN," *Mat. Res. Soc. Symp. Proc.*, 799 (2004) Z9.5.1.

Cox et al., "On the Preparation, Optical Properties and Electrical Behaviour of Aluminum Nitride," *J. Phys. Chem. Solids*, (1967) vol. 28, pp. 543-548.

Dalmau et al., Mat. Res. Soc. Proc., (2004) vol. 798, p. Y2.9.1.

DeVries et al., "Phase equilibria pertinent to the growth of cubic boron nitride," J. Cryst. Growth, 13/14 (1972) 88.

Dryburgh, "The Estimation of Maximum Growth Rate for Aluminum Nitride Crystals by Direct Sublimation," J. Crystal Growth, (1992) 125, pp. 65-68.

Dugger, "The single crystal synthesis and some properties of Aluminum Nitride", Air Force Cambridge Research Laboratories, Physical Science Research Papers, No. 656 (Aug. 1, 1975).

Dugger, The synthesis of Aluminum Nitride single crystals:, *Mat. Res. Bulletin*, 9 (1974) 331.

Epelbaum et al., "Sublimation growth of bulk AlN crystals: materials compatibility and crystal quality," *Mat. Sci. Forum*, (2002) 389-393, 1445.

Gorbatov et al., "Electrical Conductivity of Materials from Mixed Aluminum and Silicon Nitrides," *Sov. Powd. Met. Met. Ceram.*, (1970) vol. 9, pp. 917-920.

Hacke et al., "Photoluminescence Intensity and Spectral Distribution of GaN Films on SiC," (1999) *Phys. Stat. Sol.* (b), 216, 639.

Hermann et al., "Highly Si-doped AlN Grown by Plasma-Assisted Molecular-Beam Epitaxy," *Applied Phys. Letters*, (2005) vol. 86, pp. 192108-1-192108-3.

Honig, "Vapor Pressure Data for the Solid and Liquid Elements", *RCA Review*, vol. 23 (1962) 567.

International Search Report and Written Opinion for PCT/US2006/022329, dated Dec. 12, 2006.

International Preliminary Report on Patentability and Written Opinion for PCT/US2006/045540, dated Jun. 12, 2008.

International Preliminary Report on Patentability and Written Opinion for PCT/US2006/046300, dated Jun. 12, 2006.

International Search Report and Written Opinion for PCT/US2007/011075, dated Jul. 11, 2008.

International Search Report and Written Opinion for PCT/US2007/07980, dated Oct. 12, 2007.

International Search Report and Written Opinion for PCT/US2008/000597, dated May 20, 2008.

International Search Report and Written Opinion for PCT/US2008/001003, dated Aug. 5, 2008.

International Search Report for PCT/US2006/045540, dated Jul. 6, 2007.

International Search Report for PCT/US2006/046300, dated May 30, 2007.

Jahnen et al., "Pinholes, Dislocations and Strain Relaxation in InGaN, " *MRS Internet J. Nitride Semicond. Res.*, (1998) 3:39.

Kanechika et al., "n-type AlN Layer by Si Ion Implantation," *Applied Phys. Letters*, (2006) vol. 88, p. 202106.

Karel et al., "The luminescence properties of AlN with Manganese and rare earth activators under ultraviolet and cathode-ray excitation", *Czech. J. Phys.*, B20 (1970) 46.

Karpinski et al., "Equilibrium pressure of $N_2$ over GaN and high pressure solution growth of GaN", *J. Cryst. Growth*, 66 (1984) 1.

Karpov et al., "Sublimation Growth of AlN in Vacuum and in a Gas Atmosphere," *Phys. Stat. Sol.* (a), (1999) 176, p. 435.

(56) References Cited

OTHER PUBLICATIONS

Kasu et al., "Formation of Solid Solution of Al1—xSixN (0<x? 12%) Ternary Alloy," *Jap. J. Appl. Phys.*, (2001) vol. 40, Part 2, No. 10A, pp. L1048-L1050.
Kawabe et al., "Electrical and Optical Properties of AlN—a Thermostable Semiconductor," *Elec. Engin. in Japan*, (1967) vol. 87, pp. 62-70.
Kordis, "The BeO-MgO system", *J. Nuc. Mater.*, 14 (1964) 322.
Lawson et al., "Preparation of Single Crystals", Academic Press, New York (1958) pp. 18-20.
Liu et al., "A Global Growth Rate Model for Aluminum Nitride Sublimation," *J. Electrochemical. Soc.*, (2002) 149, p. G12.
Liu et al., "Characterization of AlN Crystals Grown by Sublimation," *Phys. Stat. Sol.* (a), (2001) 188, p. 769.
Liu et al., "Misfit Dislocation Generation in InGaN Epilayers on Free-Standing GaN, " *Jap. J. Appl. Physics*, (2006) 46:22, pp. L549-L551.
Ludwig et al., "Dimers [$Al_2N_4$]", *Zeitsch. f. Naturforsch.*, B54 (1999) pp. 461-465.
Matthews et al., "Defects in Epitaxial Multilayers," *J. Crystal Growth*, (1974) 27, p. 118.
Mokhov et al., "Sublimation growth of AlN bulk crystals in Ta crucibles," *Jrl. Of Crys. Growth*, (Jul. 15, 2005) vol. 281, No. 1, pp. 93-100.
Naidu et al., Eds. "Phase Diagrams of Binary Tungsten Alloys," Indian Institute of Metals, Calcutta, pp. 7-13 (1991).
Nakanishi et al., "Effects of Al Composition on luminescence properties of europim implanted $Al_xGa_{1-x}N$ (0∠x∠1)", *Phys. Stat. Sol.* (c), 0 (2003) 2623.
Nassau et al., "The Physics and Chemistry of Color," Wiley-Interscience Publication (New York 1983).
Niewa et al., "$Li_3[ScN_2]$: The first nitridoscandate (III)—Tetrahedral Sc Coordination and unusual $MX_2$ framework", *Chem. Eur. J.* 9 (2003) 4255.
Niewa et al., "Recent developments in nitride chemistry", *Chem. Mater.*, 10 (1998) 2733.
Noveski et al., "Growth of AlN Crystals on AlN/SiC Seeds by AlN Powder Sublimation in Nitrogen Atmosphere," *MRS Internet J. Nitride Semicond. Res.*, (2004) 9, 2.
Noveski et al., "Mass Transfer in AlN Crystal Growth at High Temperatures," *J. Crystal Growth*, (2004) 264, pp. 369-378.
Office Action in Japanese Patent Application No. 2003-579324, dated May 27, 2008 (English Translation).
Sun et al., "Phase relationships in the system Y—Al—O—N", *Mater. Letters*, 3-4 (1991) 76.
Parker et al., "Determination of the critical layer thickness in the InGaN/GaN heterostructures," *Applied Phys. Letters*., (1999) vol. 75, No. 18, pp. 2776-2778.
Proc. of NATO Advanced Study Inst. on Nitrogen Ceramics, University of Kent, Canterbury, U.K. (1976).
Raghothamachar et al., "Synchrotron White Beam Topography Characterization of Physical Vapor Transport Grown AlN and Ammonothermal GaN," *J. Crystal Growth*, (2002) 246, pp. 271-280.
Rojo et al., "Growth and Characterization of Epitaxial Layers on Aluminum Nitride Substrates Prepared from Bulk, Single Crystals," *J. Crystal Growth*, (2002) 240, p. 508.
Rojo et al., "Progress in the Preparation of Aluminum Nitride Substrates from Bulk Cystals," *Mat.Res. Soc. Symp. Pro.* (2002) vol. 722, pp. 5-13.
Rojo et al., "Report on the Growth of Bulk Aluminum Nitride and Subsequent Substrate Preparation," *J. Crystal Growth*, (2001) 231, p. 317.
Schlesser et al., "Growth of AlN Bulk Crystals from the Vapor Phase," *Mat. Res. Soc. Symp. Proc.*, (2002) 693, p. 19.4.1.
Schlesser et al., "Seeded Growth of AlN Bulk Single Srystals by Sublimation," *J. Crystal Growth*, 241, pp. 416-420.
Schowalter et al., "Fabrication of Native, Single-Crystal AlN Substrates," *Phys. Stat. Sol.* (c), (2003) 1-4.
Segal et al., "On Mechanisms of Sublimination Growth of AlN bulk Crystals," *J. Crystal Gowth*, (2000) 211, pp. 68-72.
Shih et al, "High-quality and crack-free $Al_xGa_{1-x}N$ (x-0.2) grown on sapphire by a two-step growth method," *Jrl. of Crys. Growth*, (Apr. 15, 2005) vol. 277, No. 1-4, pp. 44-50.
Silveira et al., "Excitonic Structure of Bulk AlN from Optical Reflectivity and Cathodoluminescense Measurements," *Phys. Review* B71, 041201® (2006).
Singh et al., "Physical Vapor Transport Growth of Large AlN Crystals," *J. Cryst. Growth*, (2003) 250, p. 107.
Slack et al., "AlN Single Crystals," *J. Crystal Growth*, (1977) 42, pp. 560-563.
Slack et al., "Growth of High Purity AlN Crystals," *Journal of Crystal Growth*, (1976) vol. 34, pp. 263-279.
Slack et al., "Properties of Crucible Materials for Bulk Growth of AlN," *Mat. Res. Soc. Proc.*, (2004) vol. 798, pp. Y10.74.1-Y10.74.4.
Slack et al., "Some Effects of Oxygen Impurities on AlN and GaN," *J. Crystal Growth*, (2002) 246, pp. 287-298.
Smart et al., "AlGaN/GaN Heterostructures on Insulating AlGaN Nucleation Layers," *Appl. Phys. Letters*, (1999) 75, p. 388.
Solid State Lighting Report (Dept. of Energy, 2007).
Song, "Strain relaxation due to V-pit formation in $InxGa1-xN$/GaN epilayers grown on sapphire," *J. Applied Phys.*, (2005) 98: 084906.
Takeuchi et al., "Optical Properties of Strained AlGaN and GaInN on GaN," *Jap. J. Appl. Phys.*, (1997) vol. 36, pp. L177-L179.
Takeya et al., "Degradation in AlGaInN Lasers," *Phys. Stat. Sol.* (c), (2003) 0, No. 7, pp. 2292-2295.
Taniyasu et al., "An aluminum nitride light-emitting diode with a wavelength of 210 nanometres", *Nature*, 441 (2006) 325.
Taniyasu et al., "Intentional control of n-type conduction for Si-doped AlN and $Al_xGa_{1-x}N$ (0.42∠—x∠ 1)", *Applied Physics Letters*, 81 (2002) 1255.
Tomiya et al., "Dislocations in GaN-Based Laser Diodes on Epitaxial Lateral Overgrown GaN Layers," *Phys. Stat. Sol.* (a), (2001) vol. 188, No. 1, pp. 69-72.
Van de Walle et al., "Doping of AlGaN Alloys," *MRS Internet J. Nitride Semicond. Res.*, (1999) 4S1, G10.4, pp. 1-12.
Van de Walle et al., "DX-center Formation in Wurtzite and Zinc-blende AlxGa1—xN," *Phys. Rev.*, (1998) B57, R2033.
Vendl et al., "The melting points of some rare-earth metal nitrides as function of the nitrogen pressure", *High Temperatures—High Pressures*, 9 (1977) 313.
Venugopal et al., "Comparison of Various Buffer Schemes to Grow GaN on Large-Area Si(111) Substrates Using Metal-Organic Chemical-Vapor Deposition," *32 J. Electronic Mat.*, vol. 32, No. 5 (2003) pp. 371-374.
Vinogradov et al., "Determination of the Melting Parameters of Aluminum Nitride, " *High Temperatures—High Pressures*, (1991) 23:685.
Wentorf Jr., "Synthesis of the cubic form of boron nitride", *J. Chem. Phys.*, 34 (1961) 809.
Yamane et al., "Preparation of GaN single crystals using a Na flux", *Chem. Mater.*, 9 (1997) 413.
Yano et al., "Growth of nitride crystals, BN. AlN and GaN by using a Na flux", *Diamond and Related Materials*, 9 (2000) 512.
Zeisel et al., "DX-behavior of Si in AlN," *Phys. Rev.*, (2000) B61, R16283.
Zhuang et al., "Seeded growth of AlN single crystals by physical vapor transport," *Jrl. of Crys. Growth*, (Jan. 25, 2006), vol. 287, No. 2, pp. 372-375.
Atobe—JJAP, 29, 150, 1990—F-Type Centers in Neutron-Irradiated AlN.
Berzina-RadEFF 157, 1089, 2002—Luminescence mechanisms of O-related defects in AlN.
Bickermann et al., "Point Defect Content and Optical Transitions in Bulk Aluminum Nitride Crystals," Phys. Stat. Sol. B 246, No. 6, pp. 1181-1183 (2009).
Bickerman pssc 0, 1993-1996, 2003—PVT growth of bulk AlN.
Bickerman—APL,103,073522, 2008—Polarization dependent below BG optical absorption of AlN bulk crystals.

(56) References Cited

OTHER PUBLICATIONS

Bradley—JVacSciTechB 21, 2558, 2003—Deep level defects and doping in high Al mole fraction AlGaN.
Summons to Attend Oral Proceedings in European Patent Application No. 03808366.3, Dec. 17, 2007, 5 pages.
Tavernier et al., "Chemical Mechanical Polishing of Gallium Nitride," Electrochemical and Solid State Latters, v. 5(8), pp. G61-G64 (2002).
Brunner—JAppPhys 82, 5090, 1997—Optical constants of epitaxial AlGaN films and their temperature dependence.
Collins—PRB 158, 833, 1967—Lattice vibration spectra of AlN.
Edgar—JCrGrwth 310, 4002, 2008—Native oxide and hydroxides and their implications for bulk AlN crystal growth.
Evans—APL 88, 06112, 2006—EPR of a donor in AlN crystals.
Freitas—pssb 240, 330, 2003—Shallow donors in GaN.
Freitas—APL 83, 2584, 2003—Properties of bulk AlN grown by thermodecomposition of $AlCl_3$—$NH_3$.
Freitas—JCrGrwth 281, 168, 2005—Optical studies of bulk and homoepitaxial films of III-V nitride semiconductors.
Gutierrez—Phil.Mag.Let. 79, 147, 1999—The formation of nanopipes caused by donor impurities in GaN; a theoretical study for the case of oxygen.
Honda—JJAP 29, L652, 1990—Electron paramagnetic center in neutron-irradiated AlN.
Hossain—SPIE 2877, 42, 1996—Study of CL spectroscopy of AlN.
Jones—JMR 14, 4344, 1999—Optical properties of AlN from VUS and ellipsometry.
Kazan—Diamond15, 1525, 2006—Phonon dynamics in AlN lattice contaminated by O.
Kazan—JAP, 98, 103529, 2005—Oxygen behavior in AlN.
Klemens—PhysB, 316-317, 413, 2002—Effect of point defects on the decay of the longitudinal optical mode.
Kovalenkov—JCrGrwth 28187, 2005—Thick AlN layers grown by HVPE.
Mason—PRB 59, 1937, 1999—Optically detected EPR of AlN single crystals.
McCluskey—PRL 80 4008 1998—Metastability of oxygen donors in AlGaN.
Meyer—Mat.Scie.EngB71,69,2000—Defects and defect identication in group III-nitrides.
Morita—JJAP 21, 1102, 1982—Optical absorption and CL of epitaxial AlN films.
Nakahata—JAmCerSoc 80, 1612, 1997—Electron spin resonance analysis of lattice defects in poly AlN.
Nakarmi—APL 94, 091903, 2009—PL studies of impurity transitions Mg-doped AlGaN alloys.
Nam—APL 86, 222108, 2005—Deep Impurity transitions involving cation vacancies and complexes in AlGaN alloys.
Nepal—APL 84, 1091, 2004—Optical properties of the nitrogen vacancyin AlN epilayers.
Nepal—APL 89, 092107, 2006—Photoluminescene studies of impurity transitions in AlGaN alloys.
Wongchotigul et al., "Low Resistivity Aluminum Nitride:Carbon (AlN:C) Films Grown by Metal Organic Chemical Vapor Deposition," 26 Materials Letters, pp. 223-226 (Mar. 1996).
Pantha—APL 91, 121117, 2007—Correlation between biaxial stress and free exciton transition in AlN.
Perry and Rutz—APL 33, p. 319, 1978—The optical absorption edge of single-crystal AlN prepared by a closed-spaced vapor process.
Salzman—pssc 0, 2541, 2003—Reduction of oxygen contamination in AlN.
Sarua—MRS 798, Y17.1, 2004—Effect of impurities on Raman and PL spectra of AlN bulk crystals.
Schlesser—JCrGrwth 281, 75, 2005—Crucible materials for growth of aluminum nitride crystals.
Schweizer—ppsb 219, 171, 2000—Investigation of oxygen-related luminescence centres in AlN ceramic.
Sedhain—APL 93, 014905, 2008—Photoluminescence properties of AlN homoepilayers with different orientations.
Shi—APL 89, 163127, 2006—Luminescence properties of AlN nanotips.
Stampfl—PRB 65, 155212, 2002—Theoretical investigation of native defects, impurities and complexes in aluminum nitride.
Strassburg—JAP 96, 5870, 2004—Growth and optical properties of large high quality AlN single crystals.
Thomas—J.Eur.Cer.Soc. 1991—Determination of the concentration of oxygen dissolved in the AlN lattice.
Trinkler—JphysCondMatt 13, 8931, 2001—Radiation induced recombination processes in AlN ceramics.
Trinkler—RadiationMeasurements 33, 731, 2001—Stimulated luminescence of AlN ceramics induced by UV radiation.
Trinkler—SPIE 2967, 85, 1997—Spectral properties of AlN ceramics.
Tuomisto—JCrGrwth 2008—Characterization of bulk AlN crystals with position annihilation spectroscopy.
Vail—JPhysCondMat18,21225, 2006—The nitrogen vacancy in AlN.
Van de Walle—AppPhysRev 95,3852 2004—First principles calculations for defects and impurities—Application s to iii-nitrides.
Watanabe-JMR13,2956,1998—Changes in optical transmittance and surface morphology of AlN thin films exposed to atmosphere.
Katayama-Yoshida et al., "Codoping method for the Fabrication of Low-Resistivity Wide Band-Gap Semiconductors in p-type GaN, p-type AlN and n-type Diamond: Prediction versus Experiment," 13 J. of Physics: Condensed Matter, pp. 8901-8914 (2001).
Office Action in Australian Patent Application No. 2003303485, dated Oct. 9, 2008, 2 pages.
Office Action in Canadian Patent Application No. 2,467,806, dated Aug. 13, 2009, 4 pages.
Office Action in Canadian Patent Application No. 2,467,806, dated Feb. 23, 2010, 2 pages.
Office Action in European Patent Application No. 02803675.4, dated May 2, 2007, 4 pages.
Office Action in European Patent Application No. 02806723.9, dated Aug. 8, 2008, 3 pages.
Office Action in European Patent Application No. 02806723.9, dated Feb. 16, 2010 (2 pages).
Office Action in European Patent Application No. 02806723.9, dated Feb. 7, 2007, 4 pages.
Office Action in European Patent Application No. 02806723.9, dated Jan. 17, 2008, 4 pages.
Office Action in European Patent Application No. 03808366.3, dated Sep. 28, 2006, 4 pages.
Office Action in European Patent Application No. 06844804.2, dated Mar. 4, 2009, 3 pages.
Office Action in Japanese Patent Application No. 2003-545445, dated Nov. 10, 2009, 3 pages.
Office Action in Japanese Patent Application No. 2003-545445, dated Sep. 30, 2008, 3 pages.
Office Action in Japanese Patent Application No. 2003-579324, dated Sep. 8, 2009, 1 page.
Office Action in Japanese Patent Application No. 2004-564648, dated Feb. 3, 2010, 2 pages.
Office Action in Japanese Patent Application No. 2004-564648, dated Jun. 24, 2009, 2 pages.
Office Action in Taiwan Patent Application No. 91137050, dated Apr. 6, 2004, 1 page (translation).
Partial International Search Report for International Application No. PCT/US07/11075, dated May 7, 2008 (2 pages).
Raghothamachar et al., "X-ray Characterization of Bulk AlN Single Crystals Grown by the Sublimation Technique," J. Crystal Growth 250(1-2), pp. 244-250 (2003).
Rojo et al., "Growth and Characterization of Epitaxial Layers on Aluminum Nitride Substrates Prepared from Bulk, Single Crystals," J. Crystal Growth 240, p. 508 (2002).
Gaska et al., "Deep-Ultraviolet Emission of AlGaN/AlN Quantum Wells on Bulk AlN," Applied Physics Letters, vol. 81, No. 24, pp. 4658-4660 (Dec. 9, 2002).
A.I. Zhmakin, "Enhancement of light extraction from light emitting diodes," Physics Reports 498 (2011) pp. 189-241.
B.J. Kim, et al., "Enhancement of light extraction efficiency of ultraviolet light emitting diodes by patterning of $SiO_2$ nanosphere arrays," Thin Solid Films 517 (2009) pp. 2742-2744.

(56) References Cited

OTHER PUBLICATIONS

Bo-Siao Cheng, et al., "Light Output Enhancement of UV Light-Emitting Diodes With Embedded Distributed Bragg Reflector," IEEE Photonics Technology Letters, vol. 23, No. 10, May 15, 2011, pp. 642-644.
C.H. Chiu, et al., "Efficiency enhancement of UV/blue light emitting diodes via nanoscaled epitaxial lateral overgrowth of GaN on a SiO2 nanorod-array patterned sapphire substrate," Journal of Crystal Growth 310 (2008) pp. 5170-5174.
Chan-Wei Hsu, et al., "Optimizing textured structures possessing both optical gradient and diffraction properties to increase the extraction efficiency of light-emitting diodes," Photonics and Nanostructures—Fundamentals and Applications (2012), pp. 1-11.
Cyril Pernot, et al., "improved Efficiency of 255-280nm AlGaN-Based Light-Emitting Diodes," Applied Physics Express 3 (2010), pp. 061004-1-061004-3.
Eun-Jun Hong, et al., "Fabrication of moth-eye structure on p—GaN layer of GaN-based LEDs for improvement of light extraction," Materials Science and Engineering B 163 (2009) pp. 170-173.
H.S. Cheong, et al., "Structural and optical properties of near-UV LEDs grown on V-grooved sapphire substrates fabricated by wet etching," Journal of Crystal Growth 298 (2007), pp. 699-702.
Hideki Kasugai, et al., "High-Efficiency Nitride-Based Light-Emitting Diodes with Moth-Eye Structure," Japanese Journal of Applied Physics, vol. 44, No. 10, 2005, pp. 7414-7417.
Hyun-Gi Hong, et al, "Enhanced light output of GaN-based near-UV light emitting diodes by using nanopatterned indium tin oxide electrodes," Semiconductor Science and Technology 21 (2006), pp. 594-597.
J.J. Dong, et al., "Ultraviolet electroluminescence from ordered ZnO nanorod array/p—GaN light emitting diodes," Applied Physics letters 100, 171109 (2012), pp. 171109-1-171109-4.
J. Shakya, et al., "III-nitride blue and UV photonic crystal light-emitting diodes," Fourth International Conference on Solid State Lighting, Proc. of SPIE vol. 5530, pp. 241-250.
Jonathan J. Wierer, Jr., "Light Extraction Methods in Light-Emitting Diodes," Optical Society of America/CLEO 2011.
Keun-Yong Ban, et al., "Ir/Ag reflector for high-performance GaN-based near UV light emitting diodes," Materials Science and Engineering B 133 (2006), pp. 26-29.
Kosuke Takehara, et al., "Indium-Tin Oxide/Al Reflective Electrodes for Ultraviolet Light-Emitting Diodes," Japanese Journal of Applied Physics 51 (2012), pp. 042101-1-042101-4.
M Ali, et al., "Enhancement of near-UV GaN LED light extraction efficiency by GaN/sapphire template patterning," Semiconductor Science and Technology 27 (2012), pp. 1-5.
M. Iwaya, et al., "Improvement of light extraction efficiency of UV-LED grown on low-dislocation-density AlGaN," Phys. Stat. Sol. (a) 200, No. 1, pp. 110-113.
M. Maier, et al., "Enhancement of (AlGaIn)N near-UV LED efficiency using freestanding GaN substrate," Phys. Stat. Col. (c) 5, No. 6, pp. 2133-2135.
Manshik Park, et al., "Study on photoluminescence of GaN-based UV-LEDs with refractive index gradient polymeric nanopatterns," Journal of Crystal Growth 326 (2011), pp. 28-32.
Masahiro Akiba, et al., "Growth of flat p-GaN contact layer by pulse flow method for high light-extraction AlGaN deep-UV LEDSs with Al-based electrode," Phys. Status Solidi C 9, No. 3-4, pp. 806-809 (2012).
Max Shatalov, et al., "AlGaN Deep-Ultraviolet Light-Emitting Diodes with External Quantum Efficiency above 10%," Applied Physics Express 5 (2012), pp. 032101-1-082101-3.
N. Lobo, et al., "Enhancement of light extraction in ultraviolet light-emitting diodes using nanopixel contact design with Al reflector," Applied Physics Letters 96 (2010), pp. 081109-1-081109-3.
Richard Gutt, et al., "AlGaN-Based 355 nm UV Light-Emitting Diodes with High Power Efficiency," Applied Physics Express 5 (2012), pp. 032101-1-032101-3.
T. Nishida, et al., "340-350 nm GaN-free UV-LEDs," Phys. Stat. Sol. (a) 200, No. 1, (2003), pp. 106-109.
Tae Hoon Seo, et al., "Enhanced light output power of near UV light emitting diodes with graphene / indium tin oxide nanodot nodes for transparent and current spreading electrode," Optics Express, vol. 19, No. 23, Nov. 7, 2011.
Tak Jeong, et al., "InGaN/AlGaN Ultraviolet Light-Emitting Diode with a Ti3O5/Al2O3 Distributed Bragg Reflector," Japanese Journal of Applied Physics, vol. 47, No. 12, 2008, pp. 8811-8814.
Tetsuhiko Inazu, et al., "Improvement of Light Extraction Efficiency for AlGaN-Based Deep Ultraviolet Light-Emitting Diodes," Japanese Journal of Applied Physics 50 (2011), pp. 122101-1-122101-3.
Tsung-Xian Lee, et al., "Light extraction analysis of GaN-based light-emitting diodes with surface texture and/or patterned substrate," Optics Express, vol. 15, No. 11, May 28, 2007, pp. 6670-6676.
U.S. Pat. No. 6,719,843, filed on Sep. 20, 2002 by Schowalter et al., and the Notice of Allowance dated Nov. 25, 2003.
U.S. Pat. No. 7,211,146, filed on Apr. 12, 2004 by Schowalter et al., the Office Action dated Jun. 2, 2006, and the Notice of Allowance dated Dec. 26, 2006.
U.S. Appl. No. 11/728,027, filed Mar. 23, 2007, by Schowalter et al., and the Office Action dated Oct. 8, 2008.
U.S. Appl. No. 12/841,350, filed Jul. 22, 2010, by Schowalter et al., and the Office Action dated May 24, 2011.
U.S. Pat. No. 6,770,135, filed on Dec. 20, 2002 by Schowalter et al., the Office Action dated Nov. 26, 2003, and the Notice of Allowance dated Mar. 15, 2004.
U.S. Appl. No. 10/910,162, filed Aug. 3, 2004, by Schowalter et al., and the Office Actions dated Mar. 24, 2006, Aug. 1, 2006, May 15, 2007, Oct. 31, 2007, Jan. 10, 2008, and Mar. 9, 2009.
U.S. Pat. No. 7,087,112, filed Dec. 2, 2003 by Rojo et al., and the Notice of Allowance dated Apr. 12, 2006.
U.S. Appl. No. 11/431,090, filed May 9, 2006, by Schowalter et al., and the Office Actions dated Apr. 1, 2008, Feb. 5, 2009, and Jul. 23, 2009.
U.S. Pat. No. 7,638,346, filed on Aug. 14, 2006 by Schowalter et al., the Office Actions dated Aug. 21, 2008 and Apr. 3, 2009, and the Notice of Allowance dated Aug. 12, 2009.
U.S. Pat. No. 7,776,153, filed on Nov. 3, 2005, by Schowalter et al., the Office Actions dated Jan. 12, 2009 and Jul. 28, 2009, and the Notice of Allowance dated Apr. 7, 2010.
U.S. Appl. No. 12/841,350, filed Jul. 22, 2010, by Schowalter et al., the Office Action dated May 24, 2011 and the Notice of Allowance dated Oct. 27, 2011.
U.S. Appl. No. 12/617,150, filed Nov. 12, 2009, by Schowalter et al., the Office Action dated Jul. 13, 2011 and the Notice of Allowance dated Oct. 27, 2011.
U.S. Appl. No. 11/448,595, filed Jun. 7, 2006, by Slack et al., and the Office Actions dated Feb. 12, 2009 and Jul. 20, 2009.
U.S. Appl. No. 11/731,790, filed Mar. 30, 2007, by Morgan et al., the Office Actions dated Dec. 14, 2009 and Oct. 14, 2010, and the Notice of Allowance dated May 12, 2011.
U.S. Appl. No. 12/827,507, filed Jun. 30, 2010, by Schujman et al.
U.S. Pat. No. 7,641,735, filed on Dec. 4, 2006, by Slack et al., the Office Actions dated Oct. 7, 2008 and May 13, 2009, and the Notice of Allowance dated Aug. 27, 2009.
U.S. Appl. No. 12/642,182, filed Dec. 18, 2009, by Slack et al.
U.S. Appl. No. 11/605,192, filed Nov. 28, 2006, by Bondokov et al., and the Office Actions dated May 14, 2008, Dec. 29, 2008 and Aug. 21, 2009; and the Notice of Allowance dated Sep. 18, 2012.
U.S. Appl. No. 12/015,957, filed Jan. 17, 2008, by Bondokov et al.; the Office Action dated Feb. 29, 2012 and the Notice of Allowance dated Aug. 1, 2012.
U.S. Appl. No. 12/020,006, filed Jan. 25, 2008, by Schowalter et al., and the Office Actions dated May 10, 2010, Oct. 22, 2010 and Aug. 3, 2012.
U.S. Appl. No. 12/764,584, filed Apr. 21, 2010, by Grandusky et al.; the Office Action dated Jan. 27, 2011; and the Notice of Allowance dated Aug. 18, 2011.
U.S. Appl. No. 13/298,570, filed Nov. 17, 2011, by Grandusky et al.
U.S. Appl. No. 12/126,334, filed 5/23/08, by Slack et al., the Office Action dated Apr. 14, 2011; and the Notice of Allowance dated Sep. 8, 2011;.

(56) References Cited

OTHER PUBLICATIONS

U.S. Appl. No. 12/813,293, filed Jun. 10, 2010, by Bettles et al.; and the Office Action dated Nov. 22, 2011.
U.S. Appl. No. 13/173,213, filed Jun. 30, 2011, by Bondokov et al.
U.S. Appl. No. 13/553,093, filed Jul. 19, 2012, by Schowalter et al.; and the Notice of Allowance dated Oct. 14, 2014.
Notification to Pay Further Search Fee for European Patent Application No. 06844590.7 dated Feb. 6, 2015, 9 pages.
Examination Report Received for European Patent Application No. 06844804.2 dated Jan. 30, 2015, 5 pages.
Examination Report Received for Japanese Application No. 2004-564684 dated Feb. 3, 2010.
Examination Report Received for Japanese Application No. 2004-564684 dated Jun. 24, 2009.
Examination Report Received for Chinese Application No. 200680045153.1 dated Jun. 4, 2012, 12 pages. (7 pages of English Translation and 5 pages of Official Copy).
Examination Report Received for Chinese Application No. 200680045153.1 dated Oct. 13, 2010, 6 pages. (English Translation only).
Examination Report Received for Chinese Application No. 200780018103.9 dated Apr. 6, 2011, 11 pages. (6 pages of English Translation and 5 pages of Official Copy).
Examination Report Received for Japanese Patent Application No. 2008-543389 dated May 22, 2012, 13 pages (6 pages of English Translation & 7 pages of Official copy).
Examination Report Received for Japanese Patent Application No. 2008-543541 dated May 15, 2012, 8 pages (4 pages of English Translation & 4 pages of Official copy).
Examination Report Received for Chinese Patent Application No. 2011800323553 dated Jan. 4, 2015, 12 pages. (8 pages of English Translation & 4 pages of Official copy).
Allerman et al., "Growth and Design of Deep-UV (240-290 nm) Light Emitting Diodes Using AlGaN Alloys", J. Crystal Growth, vol. 272, No. 1-4, Dec. 10, 2004, pp. 227-241.
Bennett et al., "High Quality InGaAs/InP and InAlAs/InP Heterostructures Beyond the Matthews-Blakeslee Critical Layer Thickness", 4th Annual conference on InP and Related Materials, Newport, RI, 1992, pp. 650-653.
Examination Report received for Chinese Patent Application No. 200880005464A, dated Sep. 9, 2013, 10 pages. (7 pages of English Translation and 3 pages of Official Copy).
Examination Report Received for Chinese Patent Application No. 200880005464.4, dated Mar. 31, 2014, 7 pages. (4 pages of English Translation & 3 pages of Official copy).
Examination Report Received for Chinese Patent Application No. 200880005464.4, dated Jul. 3, 2014, 7 pages. (3 pages of English Translation & 4 pages of Official copy).
Examination Report Received for European Patent Application No. 07774299.7, dated Jul. 25, 2014, 6 pages.
Epelbaum et al., "Natural Growth Habit of Bulk AlN Crystals", Journal of Crystal Growth, vol. 265, No. 3-4, 2004, pp. 577-581.
Examination Report Received for Japanese Patent Application No. 2008-543389, dated Aug. 20, 2013, 13 pages. (6 pages Of English Translation and 7 pages of Official Copy).
Examination Report received for Japanese Patent Application No. 2009-547307, dated Apr. 8, 2014, 7 pages (3 pages of English Translation and 4 page of Official copy).
Examination Report Received for Japanese Patent Application No. 2013-518701, dated Sep. 24, 2014, 5 pages. (2 pages of English Translation and 3 pages of Official Copy).
Khan, Asif, "AlGaN Based deep Ultraviolet Light Emitting Diodes with Emission from 250-280 nm", Abstract and presentation at the International Workshop on Nitride Semiconductors in Pittsburg, Jul. 19, 2004, 1 page.
Nishida et al., "AlGaN-Based Ultraviolet Light-Emitting Diodes Grown on Bulk AlN Substrates", Applied Physics Letters, vol. 84, No. 6, Feb. 9, 2004, pp. 1002-1003.
PCT International Patent Application No. PCT/US2006/022329, International Preliminary Report on Patentability dated Dec. 11, 2007, 7 pages.
PCT International Patent Application No. PCT/US2007/011075, International Preliminary Report on Patentability dated Nov. 11, 2008, 10 pages.
PCT International Patent Application No. PCT/US2008/000597, International Preliminary Report on Patentability dated Jul. 30, 2009, 7 pages.
PCT International Patent Application No. PCT/US2008/001003, International Preliminary Report on Patentability dated Aug. 6, 2009, 7 pages.
PCT International Patent Application No. PCT/US2011/042571, International Search Report and Written Opinion dated Sep. 19, 2011, 14 pages.
PCT International Patent Application No. PCT/US2011/042571, International Preliminary Report on Patentability dated Jan. 17, 2013, 10 pages.
PCT International Patent Application No. PCT/US2014/025317, International Search Report and Written Opinion dated Aug. 27, 2014, 13 pages.
Schujman et al., "Very Low Dislocation Density AlN Substrates for Device Applications", Proc. of SPIE, 2006, vol. 6121, 2006, pp. 61210K-1-1210K-7.
Tsao, Jeff Y., "Solid-State Lighting: Lamps, Chips and Materials for Tomorrow", Circuits and Devices Magazine, IEEE, May/Jun. 2004, pp. 28-37.

* cited by examiner

| CASE # | ENCAPSULANT THICKNESS | LENS | LENS DIAMETER | CYLINDER HEIGHT | PHOTON EXTRACTION EFFICIENCY | FAR FIELD FWHM |
|---|---|---|---|---|---|---|
| 1 | N/A | N/A | N/A | N/A | 1.0X | 120° |
| 2 | 170 μm | FUSED SILICA | 2mm | 0 | 2.2X | 87° |
| 3 | 10 μm | FUSED SILICA | 2mm | 0 | 2.2X | 114° |
| 4 | 10 μm | FUSED SILICA | 2mm | 0.5mm | 2.2X | 70° |
| 5 | 10 μm | FUSED SILICA | 2mm | 1.0mm | 1.9X | 50° |
| 6 | 10 μm | FUSED SILICA | 3mm | 1.0mm | 2.3X | 48° |
| 7 | 10 μm | FUSED SILICA | 3mm | 1.5mm | 1.9X | 32° |
| 8 | 10 μm | FUSED SILICA | 4mm | 1.6mm | 2.2X | 40° |
| 9 | 10 μm | FUSED SILICA | 4mm | 1.9mm | 2.0X | 25° |

FIG. 11

PHOTON EXTRACTION FROM NITRIDE ULTRAVIOLET LIGHT-EMITTING DEVICES

RELATED APPLICATIONS

This application is a continuation of U.S. patent application Ser. No. 13/553,093, filed on Jul. 19, 2012, which claims the benefit of and priority to U.S. Provisional Patent Application No. 61/509,278, filed Jul. 19, 2011, and U.S. Provisional Patent Application No. 61/552,138, filed Oct. 27, 2011, the entire disclosure of each of which is hereby incorporated herein by reference.

GOVERNMENT SUPPORT

This invention was made with United States Government support under contract W911NF-09-2-0068 with the United States Army. The United States Government has certain rights in the invention.

TECHNICAL FIELD

In various embodiments, the present invention relates to ultraviolet optoelectronic devices fabricated on nitride-based substrates, in particular to improving light extraction therefrom through the use of a surface treatment and attachment of an index-matching lens.

BACKGROUND

The output powers, efficiencies, and lifetimes of short-wavelength ultraviolet light-emitting diodes (UV LEDs), i.e., LEDs that emit light at wavelengths less than 350 nm, based on the nitride semiconductor system remain limited due to high defect levels in the active region. These limitations are particularly problematic (and notable) in devices designed to emit at wavelengths less than 270 nm. Most development effort has been carried out on devices formed on foreign substrates such as sapphire where defect densities remain high despite innovative defect reduction strategies. These high defect densities limit both the efficiency and the reliability of devices grown on such substrates.

The recent introduction of low-defect, crystalline aluminum nitride (AlN) substrates has the potential to dramatically improve nitride-based optoelectronic semiconductor devices, particularly those having high aluminum concentration, due to the benefits of having lower defects in the active regions of these devices. For example, UV LEDs pseudomorphically grown on AlN substrates have been demonstrated to have higher efficiencies, higher power and longer lifetimes compared to similar devices formed on other substrates. Generally, these pseudomorphic UV LEDs are mounted for packaging in a "flip-chip" configuration, where the light generated in the active region of the device is emitted through the AlN substrate, while the LED dies have their front surfaces bonded to a polycrystalline (ceramic) AlN submount. Because of the high crystalline perfection that is achievable in the active device region of such devices, internal efficiencies greater than 60% have been demonstrated. Unfortunately, the photon-extraction efficiency is often still very poor in these devices, ranging from about 4% to about 15% achieved using surface-patterning techniques.

For several reasons, the photon extraction efficiency from short-wavelength UV LEDs is poor compared to visible LEDs. Thus, the current generation of short-wavelength UV LEDs has low wall-plug efficiencies (WPE) of, at best, only a few percent, where WPE is defined as the ratio of usable optical power (in this case, emitted UV light) achieved from the diode divided by the electrical power into the device. The WPE of an LED can be calculated by taking the product of the electrical efficiency ($\eta_{el}$), the photon extraction efficiency ($\eta_{ex}$), and the internal efficiency (IE); i.e., WPE=$\eta_{el}$× $\eta_{ex}$×IE. The IE itself is the product of current injection efficiency ($\eta_{inj}$) and the internal quantum efficiency (IQE); i.e., IE=$\eta_{inj}$×IQE. Thus, a low $\eta_{ex}$ will deleteriously impact the WPE even after the IE has been improved via the reduction of internal crystalline defects enabled by, e.g., the use of the AlN substrates referenced above as platforms for the devices.

Several issues can contribute to low photon-extraction efficiency. First, even the highest-quality AlN substrates available generally have some absorption in the UV wavelength range, even at wavelengths longer than the band edge in AlN (which is approximately 210 nm). This absorption tends to result in some of the UV light generated in the active area of the device being absorbed in the substrate, hence diminishing the amount of light emitted from the substrate surface. Additionally, UV LEDs suffer because approximately half of the generated photons are directed toward the p-contact and absorbed by the p-GaN of that contact. Even when photons are directed toward the AlN surface, only 9.4% can escape from an untreated surface due to the large index of refraction of the AlN, which results in a small escape cone. Additional photons are lost on their way to the exit surface due to absorption in the AlN wafer. These losses are multiplicative and the average photon extraction efficiency is only about 2.5%.

In typical LED fabrication, the large difference in the index of refraction between the LED structure and air (and resulting lack of photon extraction) can be greatly ameliorated by using an encapsulant with an intermediate index of refraction. Specifically, many conventional designs feature a "dome" of the encapsulant material disposed over and at least partially surrounding the LED (and subsequently cured by a thermal treatment). The encapsulation increases the critical angle of total internal reflection through the top surface of the semiconductor die, which has led to significant improvements in photon-extraction efficiency for visible LEDs.

To further improve photon-extraction efficiency, attempts have been made to attach optical elements to LEDs using either an encapsulant or an adhesive. An advantage of utilizing such an optical element is that the light emitted by the diode may be directed outward in a more precise way (i.e., as defined by the shape and properties of the optical element). However, optical elements and LEDs generally have different coefficients of thermal expansion, which may result in damage to the LED or the bonding material as the LED heats up during operation. Thus, generally quite thick encapsulant layers have been utilized in order to mitigate the effects of this thermal-expansion mismatch and prevent propagation of thermal expansion mismatch-induced strain between the LED and the optical element.

Unfortunately, LED encapsulants and adhesives are generally organic and/or polymeric compounds featuring carbon-hydrogen bonds (and/or other interatomic bonds) that are easily damaged by UV radiation, leading to degradation of the encapsulant or adhesive. The degradation is particularly severe with exposure to UVC radiation (i.e., radiation at wavelengths less than 300 nm). Thus, using an encapsulant to improve photon extraction is typically ineffective with UV LEDs. And although UV-resistant encapsulants have been developed, even these compounds exhibit degradation upon exposures far less than the desired service lifetime of UV LEDs. For example, the Deep UV-200 encapsulant available from Schott North America, Inc. of Elmsford, N.Y., exhibits a 15% drop in transmittance for 300 nm light after only 1000 hours of exposure.

Thus, there is a need for an easily implementable approach to effectively increase the photon-extraction efficiency from UV LEDs that overcomes the lack of stable encapsulants that are transparent to UV radiation, particularly UVC radiation. Such an approach would desirably enable high transmittance and reliability of UV LEDs without significant degradation over the intended service lifetime of these devices, e.g., approximately 10,000 hours or even longer.

SUMMARY

In various embodiments of the present invention, the photon-extraction efficiency of UV light-emitting devices such as UV LEDs is improved via attachment of an inorganic (and typically rigid) lens directly to the LED die via a thin layer of an encapsulant (e.g., an organic, UV-resistant encapsulant compound). The lens typically includes or consists essentially of a UV-transparent (at least UVC-transparent) material such as sapphire, fused silica, or quartz. Other lens materials may be utilized, e.g., materials having an index of refraction greater than 1.3 and that are transparent and stable during exposure to high intensity short-wavelength UV radiation. The inorganic lens does not significantly degrade during operation of the UV device, resulting in at least a doubling (and even up to 2.6× or even larger increases) in the extracted quasi-continuous-wave output power of UV LEDs. In addition, the far field pattern (FWHM) of the devices may be narrowed by at least 20%. The lens is preferably shaped to minimize the amount of radiation which will undergo total internal reflection. Typically, this will be a round or hemispherical shape. In preferred embodiments, the lens shape has a cylindrical component and a hemispherical component in order to, e.g., narrow the far field pattern.

In one aspect, embodiments of the invention feature a method of forming an illumination device. A layer of non-rigid encapsulant is provided between a surface of a light-emitting semiconductor die and a surface of a rigid lens opposing the surface of the semiconductor die. The light-emitting semiconductor die preferably emits UV light. The rigid lens is attached to the semiconductor die, with the encapsulant, via application of a force sufficient to minimize the thickness of the encapsulant between the rigid lens and the semiconductor die. After attachment of the rigid lens, the thickness of the encapsulant is insufficient to prevent propagation of thermal expansion mismatch-induced strain between the rigid lens and the semiconductor die.

Embodiments of the invention may include one or more of the following in any of a variety of combinations. After attachment of the rigid lens, the thickness of the encapsulant may be approximately 10 µm or less, or even approximately 5 µm or less. The semiconductor die may emit light having a wavelength less than 300 nm. The transmittance of the encapsulant may decrease by at least 10% after at least 1000 hours of exposure to UV light. The transmittance of the rigid lens may decrease by 1% or less after at least 10,000 hours of exposure to UV light. The encapsulant may be organic, and may include or consist essentially of silicone. The rigid lens may be at least partially hemispherical, e.g., substantially hemispherical. The rigid lens may have a substantially hemispherical portion and a substantially cylindrical portion disposed thereunder (i.e., toward the semiconductor die). The rigid lens may be inorganic, and may include or consist essentially of fused silica, quartz, and/or sapphire. Prior to the provision of the layer of the encapsulant, the surface of the semiconductor die may be roughened, textured, and/or patterned. For light having a wavelength of approximately 260 nm, the index of refraction of the rigid lens may be approximately 1.5 and the index of refraction of the encapsulant may be approximately 1.4. The semiconductor die may be a light-emitting diode die or a laser die. The encapsulant may be partially or fully cured after applying the rigid lens. The diameter (or longest edge length, for lenses having polygonal surfaces) of the rigid lens may be at least twice an edge length or diameter of the semiconductor die.

In another aspect, embodiments of the invention feature an illumination device including or consisting essentially of a light-emitting semiconductor die (preferably one that emits UV light), a rigid lens for extracting light from the light-emitting semiconductor die, and a layer of encapsulant attaching the rigid lens to the light-emitting semiconductor die. The thickness of the encapsulant is insufficient to prevent propagation of thermal expansion mismatch-induced strain between the rigid lens and the light-emitting semiconductor die.

Embodiments of the invention may include one or more of the following in any of a variety of combinations. The rigid lens and the encapsulant may both be substantially transparent to light emitted by the light-emitting semiconductor die. The encapsulant may be organic, and may include or consist essentially of silicone. The rigid lens may be at least partially hemispherical, e.g., substantially hemispherical. The rigid lens may have a substantially hemispherical portion and a substantially cylindrical portion disposed thereunder. The rigid lens may be inorganic, and may include or consist essentially of fused silica, quartz, and/or sapphire. The thickness of the layer of encapsulant may be less than approximately 10 µm, or even less than approximately 5 µm. The layer of encapsulant may be disposed on a surface of the light-emitting semiconductor die that is roughened, textured, and/or patterned. The indices of refraction of the rigid lens and the encapsulant may be approximately equal to each other. For light having a wavelength of approximately 260 nm, the index of refraction of the rigid lens may be approximately 1.5 and the index of refraction of the encapsulant may be approximately 1.4. The light-emitting semiconductor die may include or consist essentially of a light-emitting diode die or a laser die. The diameter of the rigid lens may be at least twice the edge length or diameter of the light-emitting semiconductor die.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the term "substantially" means±10%, and in some embodiments, ±5%. The term "consists essentially of" means excluding other materials that contribute to function, unless otherwise defined herein. Nonetheless, such other materials may be present, collectively or individually, in trace amounts.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 11 is a table of photon extraction efficiencies and far field patterns as functions of lens dimensions and encapsulant thickness for various embodiments of the invention.

DETAILED DESCRIPTION

Figure 1A:
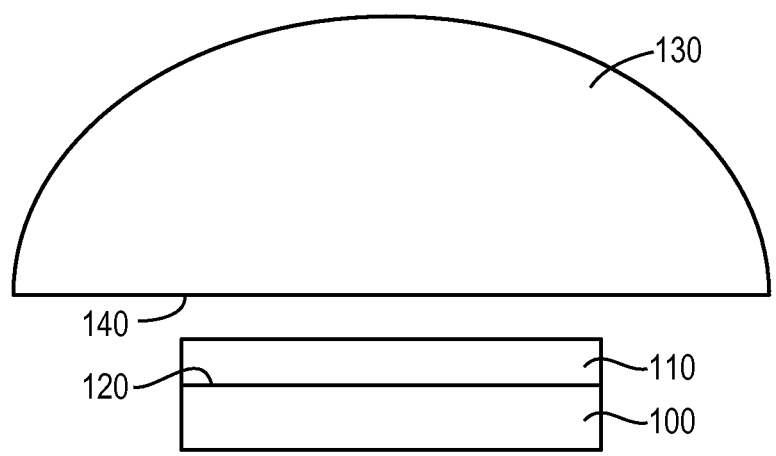
FIGS. 1A and 1B depict in cross-section the attachment of a rigid lens to an LED in accordance with various embodiments of the invention.

Embodiments of the invention include approaches to increase the photon-extraction efficiency of light-emitting devices such as UV LEDs by minimizing the total internal reflection of light transmitted from substrate into the surrounding ambient. The technique uses a thin layer (e.g., approximately 10 μm, or even thinner) of an encapsulant (e.g., an epoxy) that is transparent to short-wavelength UV radiation. FIG. 1A depicts a semiconductor die 100 having an encapsulant 110 disposed on a surface 120 thereof, as well as a lens 130 that will be attached to die 100 via the encapsulant 110. In some embodiments, the encapsulant 110 is applied to surface 140 of the lens 130 instead of or in addition to surface 120 of the die 100 prior to attachment of die 100 to lens 130.

The semiconductor die 100 may include or consist essentially of a light-emitting device such as an LED or a laser. In preferred embodiments, die 100 emits UV light. The encapsulant 110 may be organic and/or polymeric. In various embodiments of the invention, the encapsulant 110 is silicone-based, and may include or consist essentially of, for example, Deep UV-200 (mentioned above). Prior to attachment of the lens 130, the surface 120 of the die 100 may be treated, e.g., roughened, textured, and/or patterned, in order to maximize the light extraction therefrom (i.e., by increasing the critical angle for escape of the light), as described in U.S. Ser. No. 12/764,584, filed on Apr. 21, 2010, the entire disclosure of which is incorporated by reference herein.

Figure 1B:
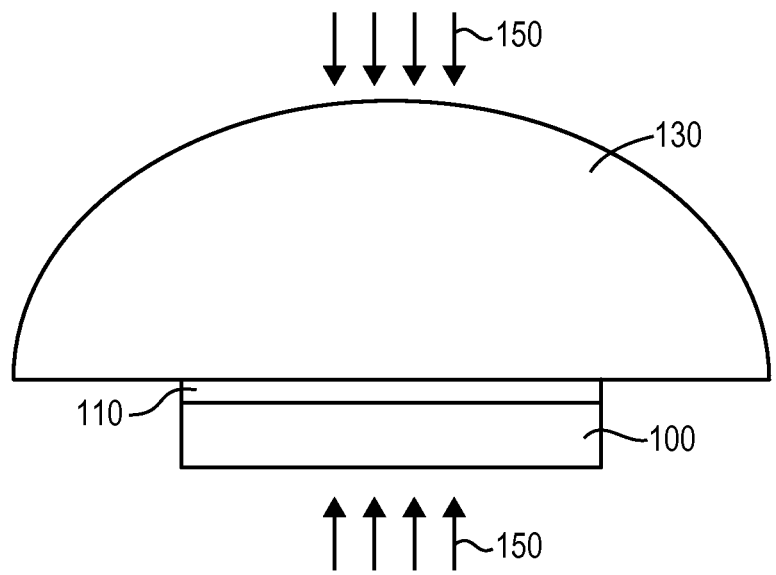

As shown in FIG. 1B, the lens 130 is attached to die 100 via the encapsulant 110 (which may also have adhesive properties). The lens 130 is typically rigid and, in preferred embodiments, is at least partially hemispherical in shape. Lens 130 may be substantially hemispherical, as shown in FIGS. 1A and 1B, or may be composed of a substantially hemispherical portion and a substantially cylindrical portion (as described below). The lens 130 is preferably inorganic, and may include or consist essentially of, for example, fused silica, quartz, and/or sapphire. In a preferred embodiment, the encapsulant 110 is heated (e.g., to approximately 60° C.) to provide enough fluidity to substantially gaplessly form an interface between lens 130 and die 100. Typically, the encapsulant 110 is heated at a temperature at which it still has sufficient viscosity to enable proper positioning of the lens 130 on the die 100, even after contact therebetween. In preferred embodiments, force (represented by arrows 150 in FIG. 1B) is applied to the die 100 and/or the lens 130 in order to minimize the space therebetween, and thus also minimize the thickness of the encapsulant 110 therein. Even in embodiments in which the encapsulant 110 degrades (due to, e.g., exposure to UV light from die 100), the thin thickness of the layer substantially prevents degradation of the performance of the device. After the lens 130 is positioned on die 100, the entire structure is typically raised to an even higher temperature (e.g., up to 150° C. for 15 hours) to cure the encapsulant 110 and solidify the attachment of the lens 130 to the die 100.

Figure 2:
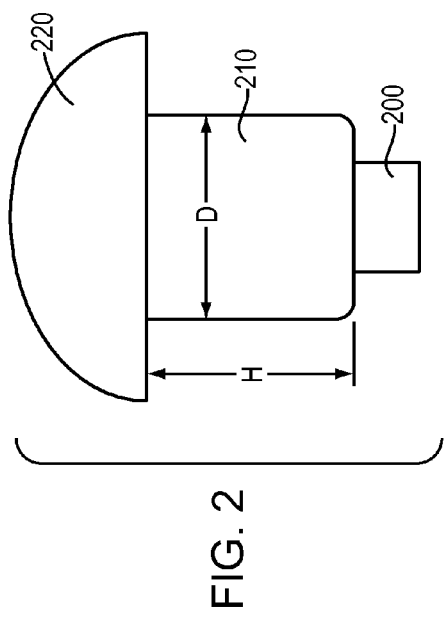
FIG. 2 is a schematic cross-section of an illumination device incorporating an LED die, an encapsulant, and a rigid lens in accordance with various embodiments of the invention.
Figure 3B:
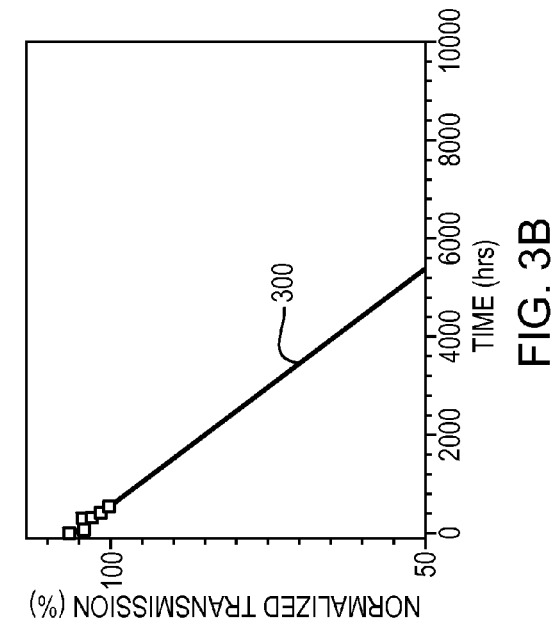
FIGS. 3A and 3B are, respectively, linear and logarithmic plots of light transmission through the encapsulant depicted in FIG. 2 as a function of time.
Figure 3A:
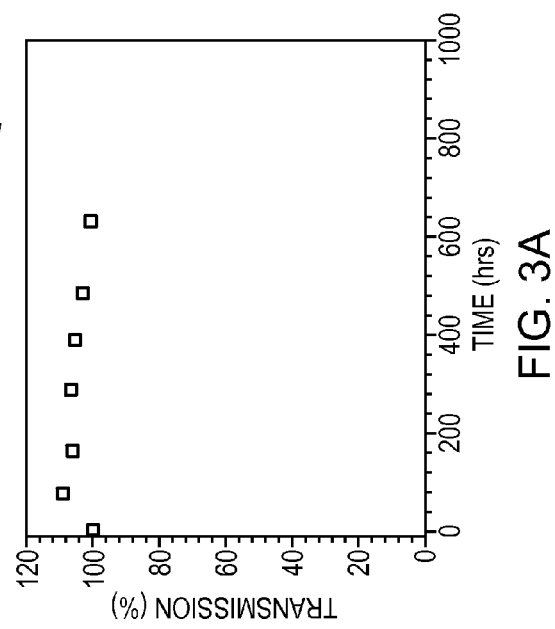

Preferred embodiments of the present invention utilize thin layers of the encapsulant material in order to ameliorate the effects of the deterioration of such layers. As mentioned above, even encapsulants rated for use with UV-emitting light tend to degrade over time, impacting the transmission of light therethrough. FIG. 2 is a schematic (with various dimensions grossly exaggerated for clarity) of an LED die 200 emitting light at a wavelength of 265 nm positioned in contact with a cylinder of encapsulant 210 (e.g., a silicone-based encapsulant such as Deep UV-200) having a diameter D of 1.2 mm and a height H of 1.0 mm, on which is disposed a lens 220. The light transmission through the encapsulant 210 was measured as a function of time, as shown in FIGS. 3A and 3B. FIG. 3A is a linear plot of light transmission (normalized to the transmission at time 0) as a function of time, and FIG. 3B is a logarithmic plots of the same data. As shown, the transmission tends to decrease as a function of time. The normalized linear fit 300 in FIG. 3B assumes the absorption coefficient of the encapsulant ($\alpha_{ENCAP}$) is linearly dependent on time and light dose (i.e., the emission power of the die, e.g., the LED power):

$$\alpha_{ENCAP} \approx C \times P_{LED} \times t;$$

$$T_{transmission} = \exp(-\alpha_{ENCAP} \times L_{ENCAP\text{-}height}) = \exp(-C \times P_{LED} \times L_{ENCAP\text{-}height} \times t).$$

In such embodiments, the impact on light transmission correlates to both the power of the LED and the thickness of the encapsulant. For example, in the case illustrated in FIGS. 3A and 3B, the LED power is 1 mW and the encapsulant thickness is 1 mm, and the lifetime L50 (i.e., the time required for the light transmission to be reduced by 50%) is over 5000 hours. Thus, substantially the same lifetime L50 for an LED emitting at 100 mW and an encapsulant thickness of 10 µm would be predicted. Therefore, particularly for high-power LEDs, preferred embodiments of the invention utilize layers of encapsulant having thicknesses less than approximately 10 µm.

It is important to note that the lifetime of the overall device (i.e., the semiconductor die with the rigid lens attached) is improved by making the encapsulant layer as thin as possible. Such thickness minimization may be achieved by applying force to the lens and/or the die during the curing process. The minimization of encapsulant thickness typically renders the encapsulant thickness insufficient for the encapsulant to function as a thermal expansion mismatch buffer (in which case one would typically increase the encapsulant thickness to prevent strain propagation therethrough and improve reliability of the device). FIGS. 4A, 4B, 5A, and 5B depict the impact of temperature change (resulting from, e.g., the elevated temperature of the die during light emission) on the strain profile within the assembled device in accordance with various embodiments of the present invention.

Figure 4A:
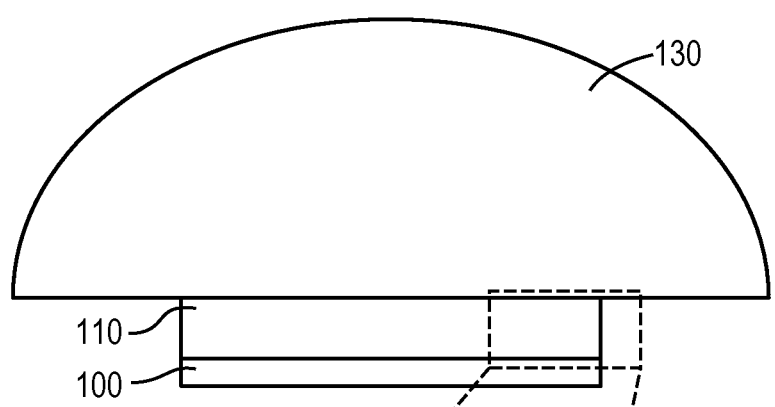
FIG. 4A is a schematic cross-section of, at room temperature, an illumination device incorporating an LED die, an encapsulant, and a rigid lens in accordance with various embodiments of the invention.
Figure 4B:
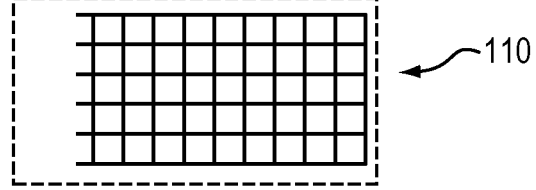
FIG. 4B is a magnified representation of the stress state within the encapsulant of FIG. 4A.

FIGS. 4A and 4B depict an assembled device and the strain state of the encapsulant 110 at approximately room temperature (e.g., after assembly but while die 100 is not operating). As shown, since the device is at approximately the temperature at which it was assembled, there is approximately no thermal-mismatch strain resulting from and/or propagating between the die 100 and the lens 130, despite the fact that their expansions of thermal expansion are different. FIG. 4B indicates that, in this situation, there is substantially no shear stress within the encapsulant 110 indicative of such thermal-mismatch strain.

Figure 5A:
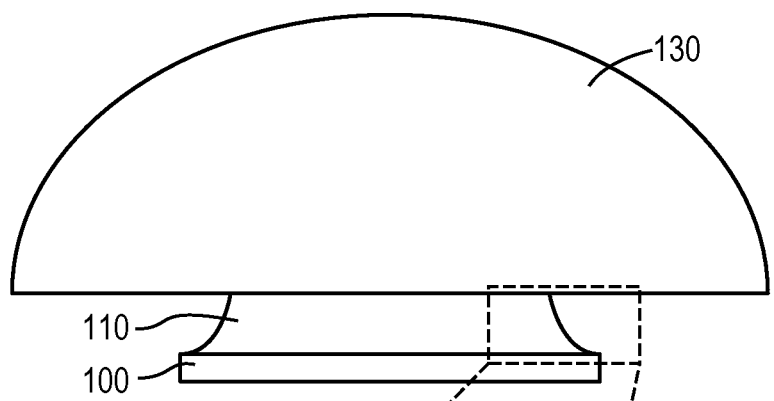
FIG. 5A is a schematic cross-section of, at elevated temperature, an illumination device incorporating an LED die, an encapsulant, and a rigid lens in accordance with various embodiments of the invention.
Figure 5B:
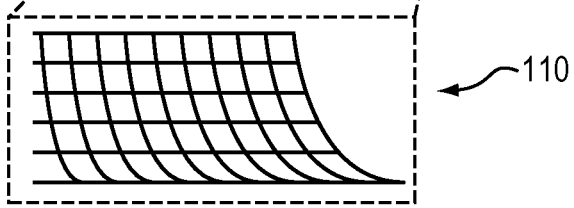
FIG. 5B is a magnified representation of the stress state within the encapsulant of FIG. 5A.

In contrast, FIGS. 5A and 5B depict the assembled device and the strain state of the encapsulant 110 at elevated temperature (e.g., during operation of die 100). As shown, the difference in thermal-expansion coefficients of the lens 130 and the die 100 results in thermal-mismatch strain propagating therebetween, as indicated by the shear stress and deformation through the entirety of the layer of encapsulant 110. Specifically, in this case the thickness of the encapsulant 110 is insufficient to accommodate the thermal mismatch-induced strain and prevent its propagation between die 100 and lens 130. (In the contrary case where the thickness of the encapsulant is sufficiently thick, at least a portion of the encapsulant layer would greatly resemble the encapsulant 110 shown in FIG. 4B, as the shear stress within the layer would be proportionally smaller.) The linear thermal expansion coefficient of die 100 may be larger than that of the lens 130, for example, larger by approximately a factor of 10 or more. In one embodiment, die 100 includes or consists essentially of single-crystal AlN and has a linear thermal expansion coefficient of approximately $5 \times 10^{-6}$/K, while lens 130 includes or consists essentially of silica and has a linear thermal expansion coefficient of approximately $0.6 \times 10^{-6}$/K. Despite the amount of shear stress through the entire thickness of the encapsulant 110, and thus the amount of thermal expansion mismatch-induced strain propagating between lens 130 and die 100, the optical performance of the assembled device is surprisingly superior due to the minimized thickness of the encapsulant 110, which limits the decrease in optical transmission due to light-induced deterioration of encapsulant 110 (which tends to occur even for encapsulants purportedly immune to UV-induced deterioration).

Figure 6A:
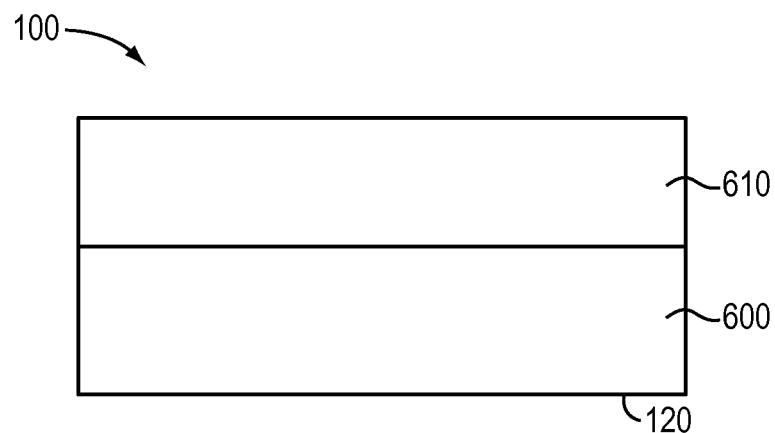
FIG. 6A is a schematic cross-section of a semiconductor die utilized in embodiments of the invention.

The impact of the thermal-mismatch strain may be decreased via reduction of the thickness of die 100 by, e.g., removal of at least a portion of the substrate, on which the light-emitting layers are formed, thereof. Such thinning may be performed in addition to, or in conjunction with, the surface patterning described above with reference to FIGS. 1A and 1B, as described in U.S. Pat. No. 8,080,833, filed Apr. 21, 2010, the entire disclosure of which is incorporated by reference herein. FIG. 6A schematically depicts a semiconductor die 100 that incorporates a substrate 600 and, thereover, a layered region 610 that includes or consists essentially of one or more epitaxially deposited semiconductor layers including the active region of die 100. The substrate 600 is typically a semiconductor material, e.g., silicon, GaN, GaAs, InP, or AlN, but in preferred embodiments includes or consists essentially of single-crystal AlN. In embodiments in which die 100 is a light-emitting device, layered region 610 typically includes one or more of buffer layers, cap layers, contact layers, quantum wells, multiple quantum well (MQW) regions (i.e., multiple quantum wells separated by thin barrier layers), as known to those of skill in the art.

Figure 6B:
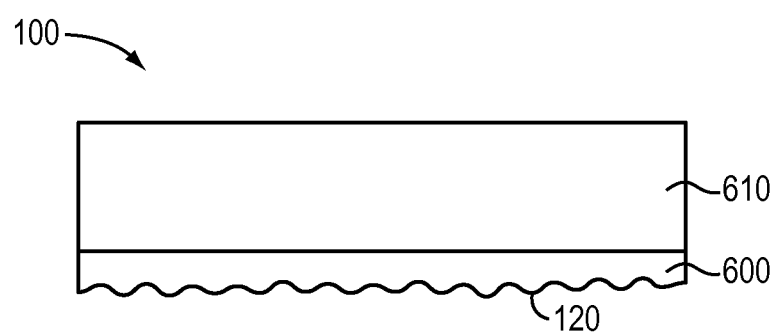
FIG. 6B depicts the semiconductor die of FIG. 6A after substrate thickness reduction and texturing performed in accordance with embodiments of the invention.

In order to mitigate the impact of thermal-mismatch strain on die 100 and enhance light transmission from die 100, at least a portion of substrate 600 may be removed and/or textured, as shown in FIG. 6B. If, for example, substrate 600 has a total thickness variation higher than about 20 µm, then the back surface 120 may be ground, for example, with a 600 to 1800 grit wheel. The removal rate of this step may be purposefully maintained at a low level (approximately 0.3-0.4 µm/s) in order to avoid damaging the substrate 600 or the layered region 610. After the optional grinding step, the back surface 120 may be polished with a polishing slurry, e.g., a solution of equal parts of distilled water and a commercial colloidal suspension of silica in a buffered solution of KOH and water. The removal rate of this step may vary between approximately 10 µm/min and approximately 15 µm/min. Substrate 600 may be thinned down to a thickness of approximately 200 µm to approximately 250 µm, or even to a thickness of approximately 20 µm to approximately 50 µm, although the scope of the invention is not limited by this range. In other embodiments, the substrate 600 is thinned to approximately 20 µm or less, or even substantially completely removed. The thinning step is preferably followed by wafer cleaning in, e.g., one or more organic solvents. In one embodiment of the invention, the cleaning step includes immersion of substrate 600 in boiling acetone for approximately 10 minutes, followed by immersion in boiling methanol for approximately 10 minutes.

Once substrate 600 is cleaned, the surface 120 thereof may be patterned, i.e., textured, by etching in a suitable solution (e.g., a basic solution such as KOH in deionized (DI) water). In another embodiment of the invention, the etching agent is a solution of NaOH in DI water. The molarity of the basic solution may vary between approximately 1M and approximately 20M, and the etching time may vary between approximately 1 minute and approximately 60 minutes. The temperature of the etching solution may vary between approximately room temperature up to approximately 100° C. Similar results may be obtained when using a higher molarity solution for shorter periods of time and vice versa. In one embodiment of the invention, substrate 600 is etched in a 4M solution of KOH and DI water for 8 minutes while maintaining the solution at approximately 20° C.

The rigid lens 130 may be formed in the desired shape and size from a larger piece of the desired material or may be directly "molded" into the desired shape and size. For example, in accordance with various embodiments of the invention, a sol-gel process is utilized to form the lens 130. For example, in order to produce a fused-silica lens, a precursor chemical solution containing nano-scaled silica particles may be inserted into a mold where it thickens into a gel. The thickened part is then removed from the mold and dried, resulting in an open-pore material having pores that may be filled with a gas. The dried part is then sintered at temperatures of, for example, greater than 1000° C., during which the part shrinks to the desired dimensions and densifies into a material nearly identical to fused silica and with high transparency in the deep UV. The lens 130 may contain trace amounts of carbon or other elements from, e.g., the precursor solution. Designations for lenses herein such as "fused silica" and the like also encompass such materials formed by solution processing (such as sol-gel processes), even if such materials also contain trace elements such as carbon. Moldable processes such as sol-gel processes enable the tuning of exact dimensions and shape with high reproducibility and low cost when producing rigid lenses such as the fused-silica lenses described above.

Figure 7:
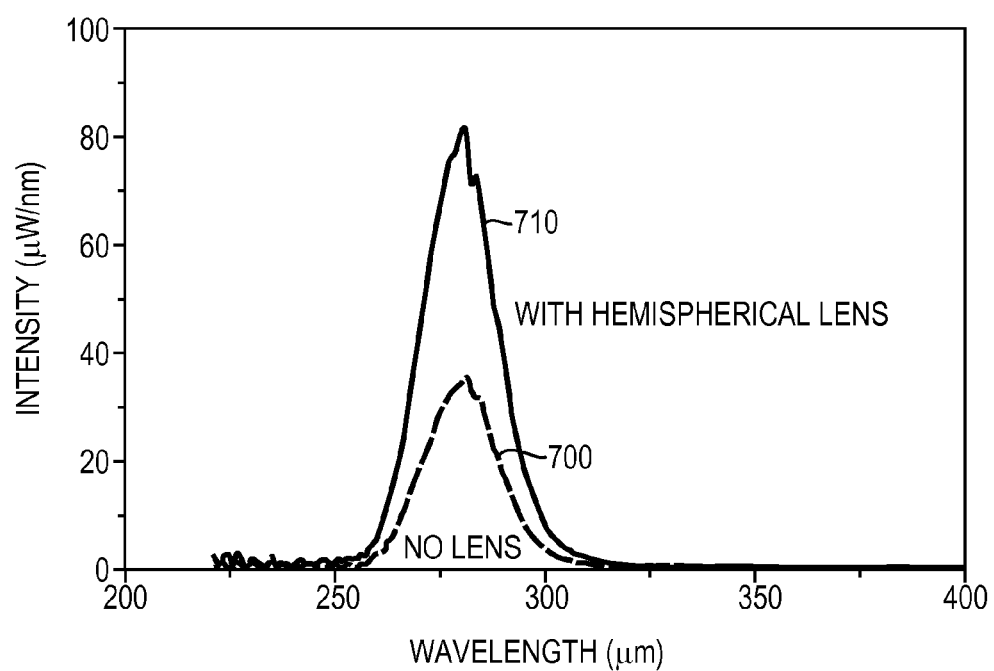
FIG. 7 depicts plots of the light intensity emitted from a UV LED with and without a rigid lens applied thereto in accordance with embodiments of the invention.

Due to the larger refractive index of the encapsulant 110 (e.g., around 1.4 at 260 nm) compared to the air, the critical angle calculated from Snell's law for total internal reflection from the substrate 600 (e.g., AlN) into the encapsulant 110 is increased, which in turn increases the photon-extraction efficiency of the device. The lens 130 then extracts substantially all of the light from the encapsulant 110, as the lens 130 preferably has a similar refractive index (e.g., around 1.5 at 260 nm). The lens 130 is also typically larger in size than the die 100 in order to extract as much light as possible from the die 100. In an embodiment, the die 100 is approximately 0.8 mm on a side, and the lens 130 is hemispherical with a diameter of approximately 2 mm. As shown in FIG. 7, the output power of an exemplary UV LED is increased by approximately 2.6× with the addition of a hemispherical fused silica lens 130 attached to the die 100 with a thin layer of an encapsulant 110. FIG. 7 includes plots, as functions of wavelength, of the intensity 700 of light emitted without the lens 130 and the intensity 710 of light emitted with the lens 130.

Figure 8:
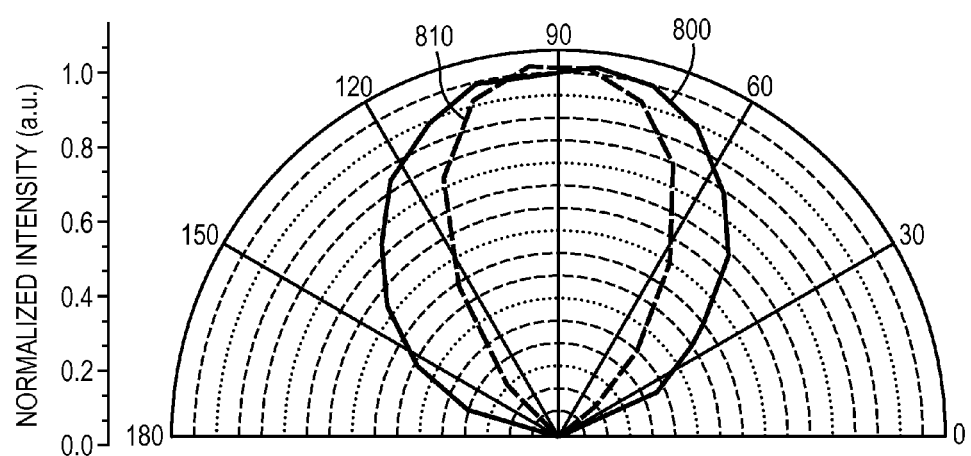
FIG. 8 depicts plots of far filed patterns of light-emitting dies with and without a rigid lens applied thereto in accordance with embodiments of the invention.

The radiation pattern of a light-emitting semiconductor die 100, e.g., an LED, may also be improved via selection of the inorganic lens material and shape of its surface. FIG. 8 depicts the full width, half-maximum (FWHM) of the radiation pattern from an LED both with and without a sapphire lens attached to the LED die 100 with a thin layer of encapsulant 110. As shown, the far field pattern 800 of the LED die 100 without lens 130 has a FWHM of approximately 120°, while with the sapphire lens 130, the far field pattern 810 has a FWHM of approximately 72°. The far field pattern may be reduced even further via use of a cylindrical-hemispherical lens, as detailed below.

Figure 9:
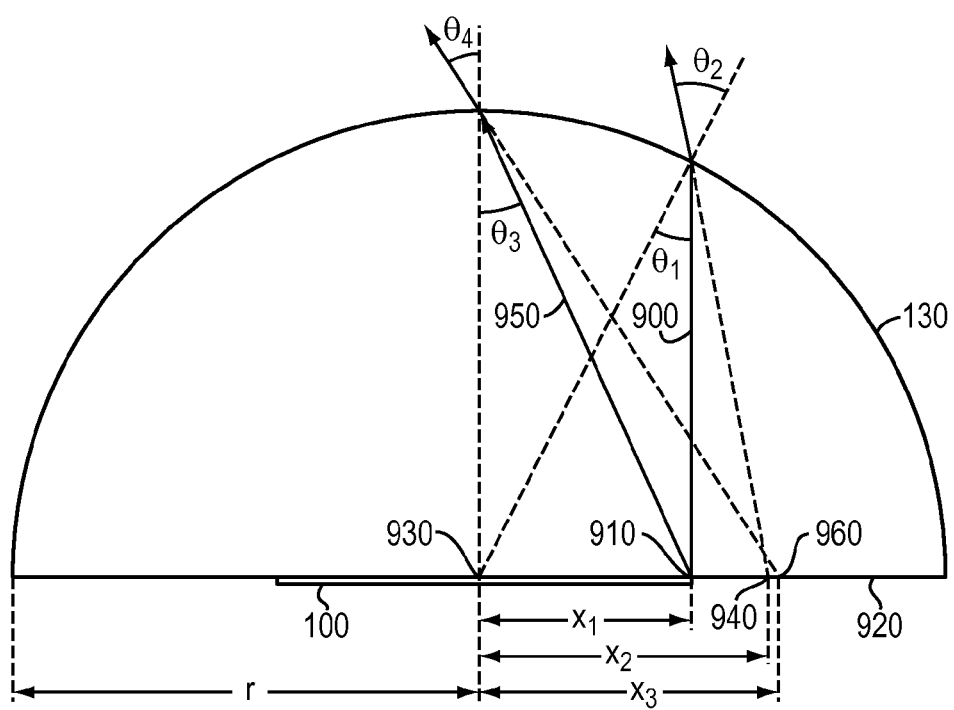
FIG. 9 is a schematic depiction of the effect of lens size on the distortion of light from a semiconductor die attached thereto in accordance with embodiments of the invention.

Typically, the radiation pattern emitted by an LED after attachment of a hemispherical lens will remain Lambertian (as shown in FIG. 8) after attachment of the lens if the encapsulant is kept very thin. However, the size of the emitting surface will generally be magnified by the addition of the lens. The amount of this magnification will be equal to the index of refraction of the lens and the distortion of the LED will be reduced by making the lens diameter larger relative to the size of the LED. That is (and as shown in FIG. 9), $$\frac{X_2}{X_1} = \frac{\frac{r*\sin\theta_2}{\cos(\theta_2-\theta_1)}}{r*\sin\theta_1} = \frac{n}{\cos(\theta_2-\theta_1)} \quad (1)$$

$$\sin\theta_2 = n*\sin\theta_1 \quad (2)$$

$$\frac{X_3}{X_1} = \frac{\frac{r}{\tan\theta_4}}{\frac{r}{\tan\theta_3}} = \frac{n}{\frac{\cos\theta_4}{\cos\theta_3}} \quad (3)$$

$$\sin\theta_4 = n*\sin\theta_3 \quad (4)$$

where a ray 900 is a light ray emitted from a point 920 on the LED 100 in the direction perpendicular to the flat surface 920 of hemispherical lens 130; $X_1$ is the distance between point 920 and center point 930 of the LED 100; $X_2$ is the distance between the point 940, where the reverse extending line of ray 900's emergent ray intersects with the flat surface 920, and center point 930; r is the radius of hemispherical lens 130; $\theta_1$ is the incident angle of ray 900; $\theta_2$ is the transmission angle of ray 900; n is the refractive index of the hemispherical lens 130; ray 950 is a light ray emitted from point 910 through the point directly above center point 930; $X_3$ is the distance between the point 960, where the reverse extending line of ray 950's emergent ray intersects with the flat surface of hemispherical lens 130, and center point 930; $\theta_3$ is the incident angle of ray 950; and $\theta_4$ is the transmission angle of ray 950.

As indicated by equations (1) and (3) above, when $X_1$ is much smaller than r, $X_2/X_1$ and $X_3/X_1$ both converge to n and the two reserve extended lines intersect almost at the same point on the flat surface of lens 130. For dies 100 with an edge length (or diameter, for circular dies) comparable to twice the radius r (i.e., the diameter) of the lens 130, the image of (and thus the light emitted from) die 100 is distorted. Thus, in preferred embodiments of the invention, the diameter of lens 130 is significantly larger (e.g., at least two times larger, five times larger, or even ten times larger or more) than an edge length or diameter of die 100 to minimize distortion of light from die 100.

Figure 10:
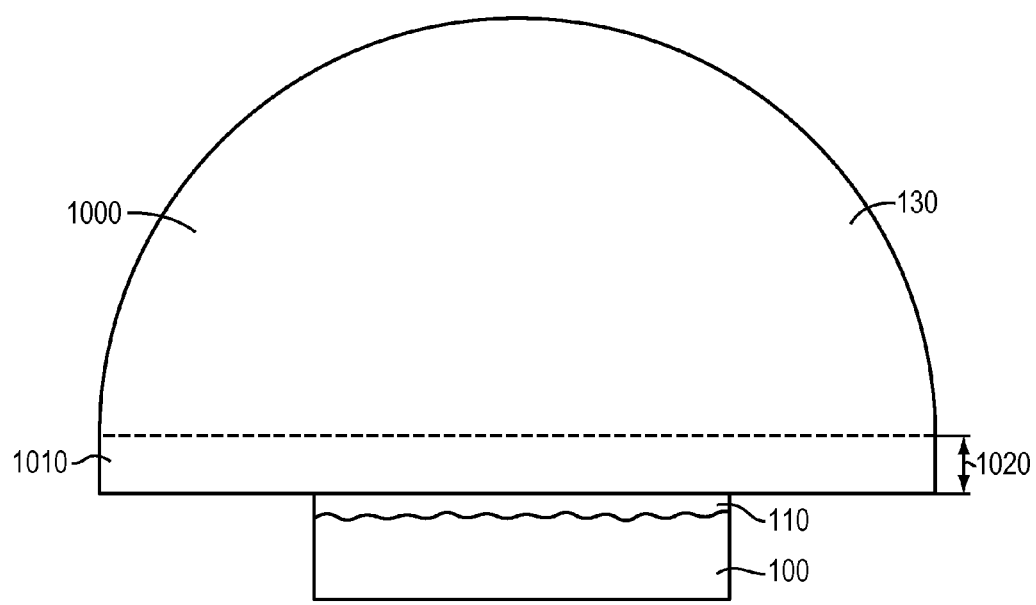
FIG. 10 is a schematic cross-section of a lens having hemispherical and cylindrical portions attached to a light-emitting semiconductor die in accordance with various embodiments of the invention.

The far field divergence of the die 100 (e.g., an LED) is improved with little or no impact on photon extraction efficiency in accordance with various embodiments of the present invention via the use of a lens 130 having a shape with a cylindrical component as well as a hemispherical component, as shown in FIGS. 10 and 11. FIG. 10 depicts an LED die 100 (e.g., a mid-UV LED) having a roughened (i.e., textured) surface 120 and attached to such a lens 130 via a thin layer of encapsulant 110 (e.g., a silicone-based encapsulant). As shown, the lens 130 has a hemispherical portion 1000 and a cylindrical portion 1010 (e.g., having a constant diameter equal to that of the largest diameter of hemispherical portion 1000) having a thickness, or "cylinder height" 1020. Simulations were performed to determine the photon extraction efficiency and far field divergence of various different embodiments. The results are compared to a baseline value of photon extraction efficiency for a bare (but roughened) LED without the lens 130 or encapsulant 110, shown as Case 1 in FIG. 11. Cases 2 and 3 represent embodiments in which the lens 130 is purely hemispherical (i.e., no cylindrical component), demonstrating the above-described increase in photon extraction efficiency and modest improvement in the far field divergence. As FIG. 11 illustrates, increasing the thickness of the cylindrical component of the lens enables the decrease of far field divergence to at least 40° FWHM with little or no deleterious effect on the photon extraction efficiency, and to even lower levels (i.e., to at least) 25° with only modest impact on the photon extraction efficiency (which remains much improved over that of the Case 1 baseline value). This nearly collimated beam of UV light is very desirable for certain applications that utilize a concentrated beam. As also shown in FIG. 11, increases in the lens diameter also tend to improve photon extraction efficiency and to decrease the far field divergence, as also discussed above.

In addition to improving the light extraction efficiency of a single semiconductor die, embodiments of the invention exhibit similar results when utilizing an array of two or more semiconductor dies (e.g., LED dies). For example, a 4×4 array of dies may be used with a rigid lens having a diameter that is significantly larger (e.g., at least two times larger, five times larger, or even ten times larger or more) than an edge length or diameter of the array to minimize distortion of light. Modeling was performed for arrays of different sizes (i.e., different numbers of dies) and showed that a relatively larger diameter of the lens compared to the edge length or diameter of a full array may be necessary to achieve similar improvement of the photon extraction efficiency compared to embodiments incorporating a single small semiconductor die. The modeling results are shown in the table below.

| Size of LED array | Edge Lengths of the Array | Lens Material | Lens Diameter | Photon Extraction Efficiency | Far Field FWHM |
| --- | --- | --- | --- | --- | --- |
| 1 × 1 | 0.8 × 0.8 mm | N/A | N/A | 1.0× | 120° |
| 1 × 1 | 0.8 × 0.8 mm | Fused Silica | 2 mm | 2.2× | 114° |
| 3 × 3 | 3.8 × 3.4 mm | Fused Silica | 6 mm | 1.9× | 140° |
| 3 × 3 | 3.8 × 3.4 mm | Fused Silica | 8 mm | 2.2× | 134° |
| 4 × 4 | 5.3 × 4.7 mm | Fused Silica | 8 mm | 1.9× | 144° |
| 4 × 4 | 5.3 × 4.7 mm | Fused Silica | 10 mm | 2.2× | 140° |
| 5 × 5 | 6.8 × 6.0 mm | Fused Silica | 10 mm | 1.9× | 144° |
| 5 × 5 | 6.8 × 6.0 mm | Fused Silica | 14 mm | 2.2× | 134° |

In addition, a 3×3 array of light-emitting semiconductor dies was integrated with a 6 mm diameter rigid lens and exhibited an improvement of light extraction efficiency of 1.4×, even though the lens was not large enough to fully optimize the photon extraction efficiency. Therefore, embodiments of the invention incorporating even larger lenses will exhibit improvements in photon extraction efficiency of 2× or even more.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. An illumination device comprising:
   a ultraviolet (UV) light-emitting semiconductor die;
   a rigid lens for extracting light from the light-emitting semiconductor die; and
   a layer of encapsulant attaching the rigid lens to the light-emitting semiconductor die,
   wherein (i) a thickness of the encapsulant is insufficient to prevent propagation of thermal expansion mismatch-induced strain between the rigid lens and the light-emitting semiconductor die, and (ii) the rigid lens has (a) a substantially hemispherical portion and (b) a substantially cylindrical portion disposed between the substantially hemispherical portion and the layer of encapsulant, the substantially cylindrical portion having a straight vertical sidewall.

2. The illumination device of claim 1, wherein the thickness of the layer of encapsulant is less than approximately 10 µm.

3. The illumination device of claim 1, wherein the encapsulant is organic.

4. The illumination device of claim 1, wherein the encapsulant comprises silicone.

5. The illumination device of claim 1, wherein the rigid lens is inorganic.

6. The illumination device of claim 1, wherein the rigid lens comprises at least one of fused silica, quartz, or sapphire.

7. The illumination device of claim 1, wherein the rigid lens and the encapsulant are both substantially transparent to light emitted by the light-emitting semiconductor die.

8. The illumination device of claim 1, wherein the layer of encapsulant is disposed on a surface of the light-emitting semiconductor die, the surface being at least one of roughened, textured, or patterned.

9. The illumination device of claim 1, wherein indices of refraction of the rigid lens and the encapsulant are approximately equal to each other.

10. The illumination device of claim 1, wherein, for light having a wavelength of approximately 260 nm, the index of refraction of the rigid lens is approximately 1.5 and the index of refraction of the encapsulant is approximately 1.4.

11. The illumination device of claim 1, wherein the light-emitting semiconductor die is a light-emitting diode die.

12. The illumination device of claim 1, wherein the light-emitting semiconductor die is a laser die.

13. The illumination device of claim 1, wherein a radius of the substantially cylindrical portion of the rigid lens is at least twice an edge length or diameter of the light-emitting semiconductor die.

14. The illumination device of claim 1, wherein the semiconductor die emits light having a wavelength less than 300 nm.

15. The illumination device of claim 1, wherein the thickness of the layer of encapsulant is less than approximately 5 µm.

16. The illumination device of claim 1, wherein the substantially cylindrical portion of the rigid lens degrades a photon extraction efficiency of the illumination device.

17. The illumination device of claim 1, wherein the substantially cylindrical portion of the rigid lens has a thickness greater than 0.5 mm.

18. The illumination device of claim 1, wherein the substantially cylindrical portion of the rigid lens has a thickness greater than 1 mm.

19. An illumination device comprising:
   a ultraviolet (UV) light-emitting semiconductor die;
   a rigid lens for extracting light from the light-emitting semiconductor die; and
   a layer of encapsulant attaching the rigid lens to the light-emitting semiconductor die,
   wherein (i) a thickness of the encapsulant is less than approximately 10 µm, and (ii) the rigid lens has (a) a substantially hemispherical portion and (b) a substantially cylindrical portion disposed between the substantially hemispherical portion and the layer of encapsulant, the substantially cylindrical portion having a straight vertical sidewall.

20. The illumination device of claim 19, wherein the thickness of the layer of encapsulant is less than approximately 5 µm.

21. The illumination device of claim 19, wherein the substantially cylindrical portion of the rigid lens degrades a photon extraction efficiency of the illumination device.

22. The illumination device of claim 19, wherein the substantially cylindrical portion of the rigid lens has a thickness greater than 0.5 mm.

23. The illumination device of claim 19, wherein the substantially cylindrical portion of the rigid lens has a thickness greater than 1 mm.

24. A method of operating an illumination device, the method comprising:
   providing an illumination device comprising:
     a ultraviolet (UV) light-emitting semiconductor die,
     a rigid lens for extracting light from the light-emitting semiconductor die, and
     a layer of encapsulant attaching the rigid lens to the light-emitting semiconductor die, wherein (i) a thickness of the encapsulant is less than approximately 10 µm, and (ii) the rigid lens has (a) a substantially hemispherical portion and (b) a substantially cylindrical portion disposed between the substantially hemispherical portion and the layer of encapsulant, the substantially cylindrical portion having a straight vertical sidewall; and
   operating the light-emitting semiconductor die for at least 1000 hours to expose the rigid lens and the layer of encapsulant to UV light,
   wherein, after operation of the light-emitting semiconductor die, (i) a transmittance of the layer of encapsulant decreases by at least 10%, and (ii) a transmittance of the rigid lens decreases by no more than 1%.

\* \* \* \* \*

UNITED STATES PATENT AND TRADEMARK OFFICE
CERTIFICATE OF CORRECTION

PATENT NO. : 10,074,784 B2
APPLICATION NO. : 14/596806
DATED : September 11, 2018
INVENTOR(S) : Leo J. Schowalter et al.

It is certified that error appears in the above-identified patent and that said Letters Patent is hereby corrected as shown below:

In the Claims

In Claim 1, Column 11, Line 64, after "wherein (i);" insert --a--.

Signed and Sealed this
Thirteenth Day of November, 2018

Andrei Iancu
*Director of the United States Patent and Trademark Office*